United States Patent
Yamamuro

(10) Patent No.: US 10,368,447 B2
(45) Date of Patent: Jul. 30, 2019

(54) COMPONENT MOUNTING MACHINE

(71) Applicant: FUJI CORPORATION, Chiryu (JP)

(72) Inventor: Junichi Yamamuro, Chiryu (JP)

(73) Assignee: FUJI CORPORATION, Chiryu (JP)

(*) Notice: Subject to any disclaimer, the term of this patent is extended or adjusted under 35 U.S.C. 154(b) by 146 days.

(21) Appl. No.: 15/313,678

(22) PCT Filed: May 28, 2014

(86) PCT No.: PCT/JP2014/064141
§ 371 (c)(1),
(2) Date: Nov. 23, 2016

(87) PCT Pub. No.: WO2015/181910
PCT Pub. Date: Dec. 3, 2015

(65) Prior Publication Data
US 2017/0171983 A1  Jun. 15, 2017

(51) Int. Cl.
*B23P 19/00* (2006.01)
*H05K 3/30* (2006.01)
(Continued)

(52) U.S. Cl.
CPC .............. *H05K 3/303* (2013.01); *B25J 15/04* (2013.01); *H05K 13/041* (2018.08);
(Continued)

(58) Field of Classification Search
CPC ......... Y10T 29/53178; Y10T 29/53174; Y10T 29/4913; Y10T 29/49133; Y10T 29/53261;
(Continued)

(56) References Cited

U.S. PATENT DOCUMENTS 4,794,689 A * 1/1989 Seno .................. H05K 13/0452
29/740
6,334,840 B1 * 1/2002 Asai ................... H05K 13/0409
29/740

FOREIGN PATENT DOCUMENTS

JP  6-24882 U    4/1994
JP  4969609 B2 * 7/2012

OTHER PUBLICATIONS

JP_4969609_B2_ORIGINAL.pdf.*
(Continued)

*Primary Examiner* — Thiem D Phan
(74) *Attorney, Agent, or Firm* — Oblon, McClelland, Maier & Neustadt, L.L.P.

(57) ABSTRACT

A chuck device is provided with multiple types of chuck claws clamping a component, a chuck claw switching mechanism switching the chuck claw in use among the multiple chuck claws based on the type of component to be clamped, and a driving mechanism causing the chuck claw subjected to the switching by a chuck claw switching mechanism perform a clamping operation. The chuck claw switching mechanism causes the respective chuck claws to move vertically independently of each other and performs switching of the chuck claw in use by a rotating cylindrical cam in a state where rotation of a tubular guide member placed on an outer peripheral side of a cylindrical cam is locked. A rotation locking member locking the rotation of the tubular guide member during switching of the chuck claw in use and a cam follower moving the rotation locking member are disposed in a mounting head.

5 Claims, 22 Drawing Sheets

(51) Int. Cl.
*B25J 15/04* (2006.01)
*H05K 13/04* (2006.01)

(52) U.S. Cl.
CPC ..... *H05K 13/0404* (2013.01); *H05K 13/0408* (2013.01); *Y10T 29/53174* (2015.01)

(58) Field of Classification Search
CPC .......... Y10T 83/8703; Y10T 29/53265; H05K 3/303; H05K 13/041; H05K 13/0404; H05K 13/0413; H05K 13/04; H05K 13/0452; H05K 13/0408; H05K 13/02; H05K 13/022; B25J 15/04; H01L 21/67745; H01L 21/67766; H01L 21/67386; G03F 7/70825
USPC ......... 29/740, 739, 714, 743, 757, 759, 809, 29/832, 834; 221/210; 269/903
See application file for complete search history.

(56) References Cited

OTHER PUBLICATIONS

JP_4969609_B2_TRANSLATED.pdf.*
International Search Report dated Aug. 26, 2014 in PCT/JP2014/064141 filed May 28, 2014.

* cited by examiner

Front view

Right side view

Rear view

Bottom view

D-D cross-sectional view

A-A cross-sectional view

B-B cross-sectional view

C-C cross-sectional view

Front view

Right side view

During lock release

COMPONENT MOUNTING MACHINE

TECHNICAL FIELD

The present application relates to a component mounting machine that holds a chuck device, which clamps a component to be mounted on a circuit board or the like, on a mounting head.

BACKGROUND ART

When mounting components on a circuit board or the like with a component mounting machine, large components and components with a special shape that are difficult to pick up using a suction nozzle are clamped and carried by chuck claws of a chuck device. Conventionally, many chuck devices clamp the component from both sides with a pair of (two) chuck claws; however, as disclosed in PTL 1, there are also items with two pairs of (four) chuck claws arranged at an interval of 90° that allows the two pairs of chuck claws to be put into a clamping operation at the same time so that the component is clamped from four directions.

CITATION LIST

Patent Literature

PTL 1: JP-UM-A-6-24882

SUMMARY

For each of the chuck devices configured as described above, the size and shape of the component that can be gripped by a single chuck device is limited, and thus the chuck device is required to be replaced in accordance with the size and shape of the component to be clamped. Accordingly, the frequency with which the chuck device is replaced during production increases, productivity is reduced, and a larger number of types of chuck devices must be prepared, which leads to an increase in device cost.

An object of the present disclosure is to provide a component mounting machine allowing the frequency with which a chuck device is replaced in accordance with the size and shape of a component to be clamped to be significantly reduced, productivity to be improved, a significantly smaller number of types of chuck devices to be prepared, and device costs to be reduced.

In order to resolve the above-described problems, the present disclosure provides a component mounting machine including: a chuck device held on a mounting head, the chuck device being provided with multiple types of chuck claws configured to clamp a component, a chuck claw switching mechanism configured to switch the chuck claw in use among the multiple types of chuck claws in accordance with the type of the component to be clamped, and a driving mechanism configured to cause the chuck claws switched by the chuck claw switching mechanism to perform a clamping operation, wherein the chuck claw switching mechanism is configured to use a cylindrical cam, the multiple types of chuck claws are arranged at predetermined intervals around the cylindrical cam, and a cam follower provided on each of the chuck claws is configured to fit into a cam groove in an outer peripheral surface of the cylindrical cam, wherein a tubular guide member that guides upward and downward movement of each of the chuck claws is provided concentrically on an outer peripheral side of the cylindrical cam, the respective chuck claws are configured to be moved upward and downward independently of each other by the cylindrical cam being rotated in a state where rotation of the tubular guide member is locked when the switching is performed to the chuck claw in use among the multiple types of chuck claws, the chuck claw not used among the multiple types of chuck claws is configured to be lifted to a retraction position not interfering with the clamping operation of the chuck claw in use, and the chuck claw in use is configured to be lowered to a clamping operation position below the retraction position, wherein a rotation locking member configured to lock the rotation of the tubular guide member during the switching of the chuck claw in use and a rotation locking member moving mechanism configured to move the rotation locking member between a lock position at which the rotation of the tubular guide member is locked and an unlock position at which the lock is released are provided in the mounting head, and wherein the respective chuck claws are moved upward and downward independently of each other by the cylindrical cam being rotated based on rotation of a rotary shaft of the mounting head in a state where the rotation of the tubular guide member is locked by the rotation locking member being moved to the lock position by the rotation locking member moving mechanism when switching is performed of the chuck claw in use.

In the present disclosure, the multiple types of chuck claws are provided in a single chuck device and the chuck claw switching mechanism performs the switching of the chuck claw in use in accordance with the type of the component to be clamped, and thus multiple types of components that are different in size and shape can be clamped with the single chuck device. Accordingly, the frequency with which the chuck device is replaced in accordance with the size and shape of a component to be clamped can be significantly reduced, productivity can be improved, the number of types of chuck devices that must be prepared can be significantly reduced, and device costs can be reduced.

Since the chuck claw switching mechanism is configured to lift the chuck claws not used among the multiple types of chuck claws to the retraction position not interfering with the clamping operation of the chuck claw in use, operations similar to those performed by a conventional chuck device provided with only one type of chuck claw can be performed even by the chuck device provided with multiple types of chuck claws.

The chuck claw switching mechanism is configured to use the cylindrical cam, the multiple types of chuck claws are arranged at the predetermined intervals around the cylindrical cam, the cam follower provided on each of the chuck claws fits into the cam groove in the outer peripheral surface of the cylindrical cam, the tubular guide member guiding the upward and downward movement of each of the chuck claws is provided concentrically on the outer peripheral side of the cylindrical cam, and the respective chuck claws are configured to be moved upward and downward independently of each other by the cylindrical cam being rotated in the state where the rotation of the tubular guide member is locked when the switching is performed to the chuck claw in use among the multiple types of chuck claws. Accordingly, the respective chuck claws can be moved upward and downward independently of each other and the chuck claw in use can be switched using a relatively simple configuration.

In the chuck device according to the present disclosure, the rotation of the tubular guide member needs to be locked during the switching of the chuck claw in use. According to the chuck device disclosed in the description of PCT/JP2013/077250, which was previously filed by the present applicant, a rotation locking member that locks rotation of a tubular guide member is provided in a chuck claw switching area in a component mounting machine and the rotation of the tubular guide member is locked by the rotation locking member by the chuck device held by a mounting head being moved toward the chuck claw switching area by movement of the mounting head during switching of a chuck claw in use. In this configuration, however, the chuck device held by the mounting head needs to be moved toward the chuck claw switching area in the component mounting machine by the movement of the mounting head during the switching of the chuck claw in use and, as such, a chuck claw switching operation takes time and a drawback arises in the form of an increase in tact time.

However, in the present disclosure, the rotation locking member and the rotation locking member moving mechanism are provided in the mounting head, and thus the rotation locking member can be moved to the lock position by the rotation locking member moving mechanism and the rotation of the tubular guide member can be locked regardless of the position of the chuck device held by the mounting head. Accordingly, the chuck device does not have to be moved to the chuck claw switching area in the component mounting machine during the switching of the chuck claw in use, and the switching operation of the chuck claw can be performed at any time so long as a component is not clamped, such as when returning to a component supply position after the component clamped by the chuck device has been mounted on the circuit board or the like, and may also be performed in parallel with other operations. Accordingly, an increase in takt time attributable to the switching operation of the chuck claw can be prevented.

In the present disclosure, multiple lock holes having a predetermined positional relationship with the multiple types of chuck claws may be formed in the tubular guide member and the rotation of the tubular guide member may be locked even in a state where any one of the multiple types of chuck claws has been lowered to the clamping operation position because the rotation locking member is configured to be fitted into any one of the multiple lock holes by the rotation locking member being moved to the lock position. According to this configuration, the tubular guide member does not have to be rotated when the rotation of the tubular guide member is locked by the rotation locking member and the rotation of the tubular guide member can be simply locked by the rotation locking member.

However, there may be cases in which an operator manually grabs and rotates the tubular guide member while, for example, the component mounting machine remains stopped, resulting in the chuck claw being switched and the switching state of the chuck claws becoming unclear.

As a countermeasure, the rotation locking member moving mechanism may be configured to be capable of moving the rotation locking member to not only the lock position and the unlock position but also a switching initialization position at which the switching state of the chuck claw returns to a certain state, a rotation stopper may be disposed in an outer peripheral portion of the tubular guide member, and the switching state of the chuck claw may return to the certain state by the tubular guide member being rotated along with the cylindrical cam based on the rotation of the rotary shaft of the mounting head in a state where the rotation locking member has been moved to the switching initialization position by the rotation locking member moving mechanism, the rotation of the tubular guide member being stopped by the rotation stopper hitting against the rotation locking member during the rotation, and the cylindrical cam being rotated to reach a certain position by the rotary shaft of the mounting head continuing to rotate thereafter. According to this configuration, the relationship between a rotation angle of the tubular guide member and a rotation angle of the cylindrical cam can return to the certain state, and thus the switching state of the chuck claw can return to the certain state.

DESCRIPTION OF EMBODIMENTS

Figure 1:
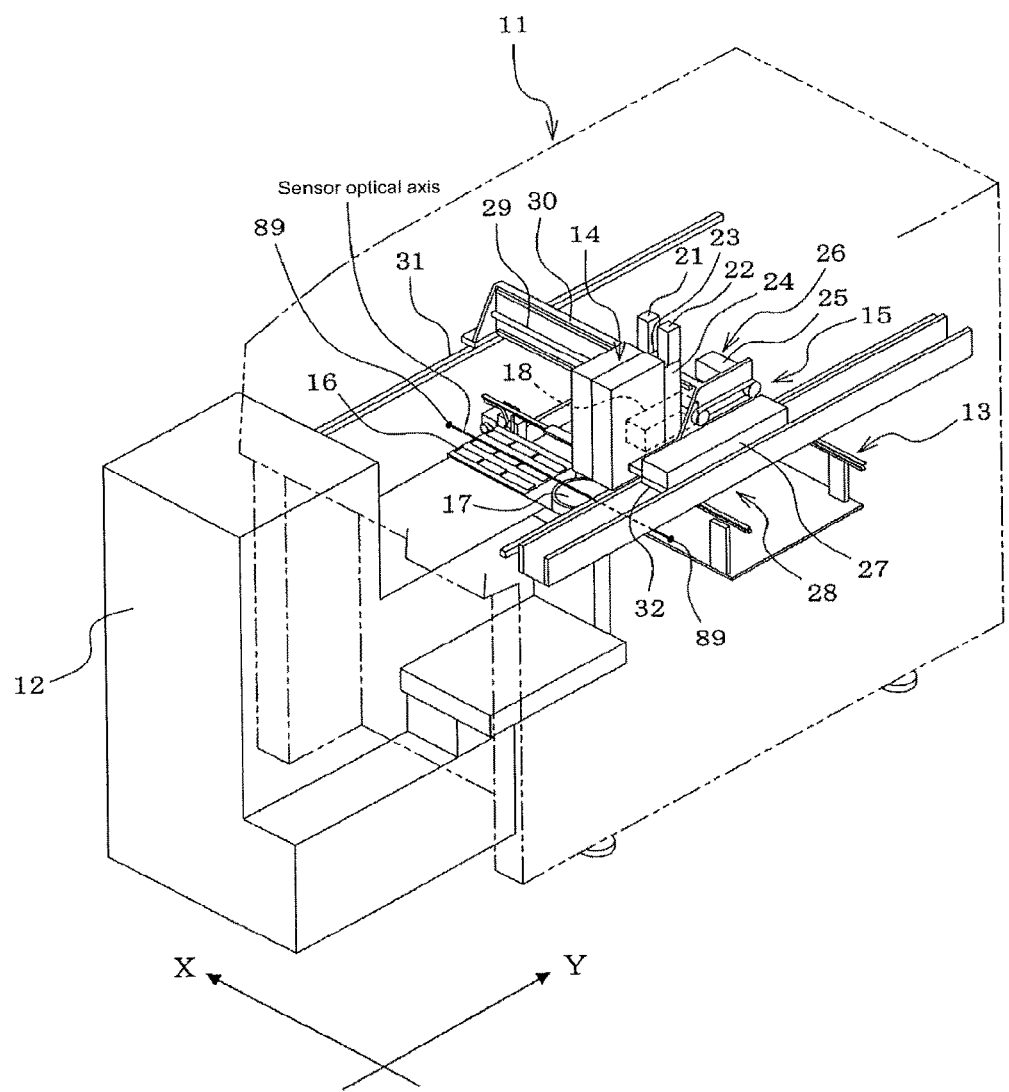
FIG. 1 is a perspective view of a component mounting machine illustrating an embodiment of the present disclosure.

Hereinafter, a specific embodiment of the present disclosure will be described. Firstly, the configuration of component mounting machine 11 will be described based on FIG. 1.

Component supply device 12 that supplies components is detachably set on component mounting machine 11. Component supply device 12 that is set on component mounting machine 11 may be any one of a tray feeder, a tape feeder, a bulk feeder, a stick feeder, and the like. Of course, component supply device 12 that is set on component mounting machine 11 may be a combination of the multiple types of feeders. Conveyor 13 that conveys a circuit board (not illustrated), mounting head 14 that mounts the component supplied from the component supply device 12 on the circuit board, XY-axis moving mechanism 15 that moves mounting head 14 in XY-axis directions (leftward, rightward, forward, and backward), tool station 16 for loading tools for replacement (chuck device 40 for replacement and suction nozzles for replacement), and the like are provided in component mounting machine 11.

Figure 3:
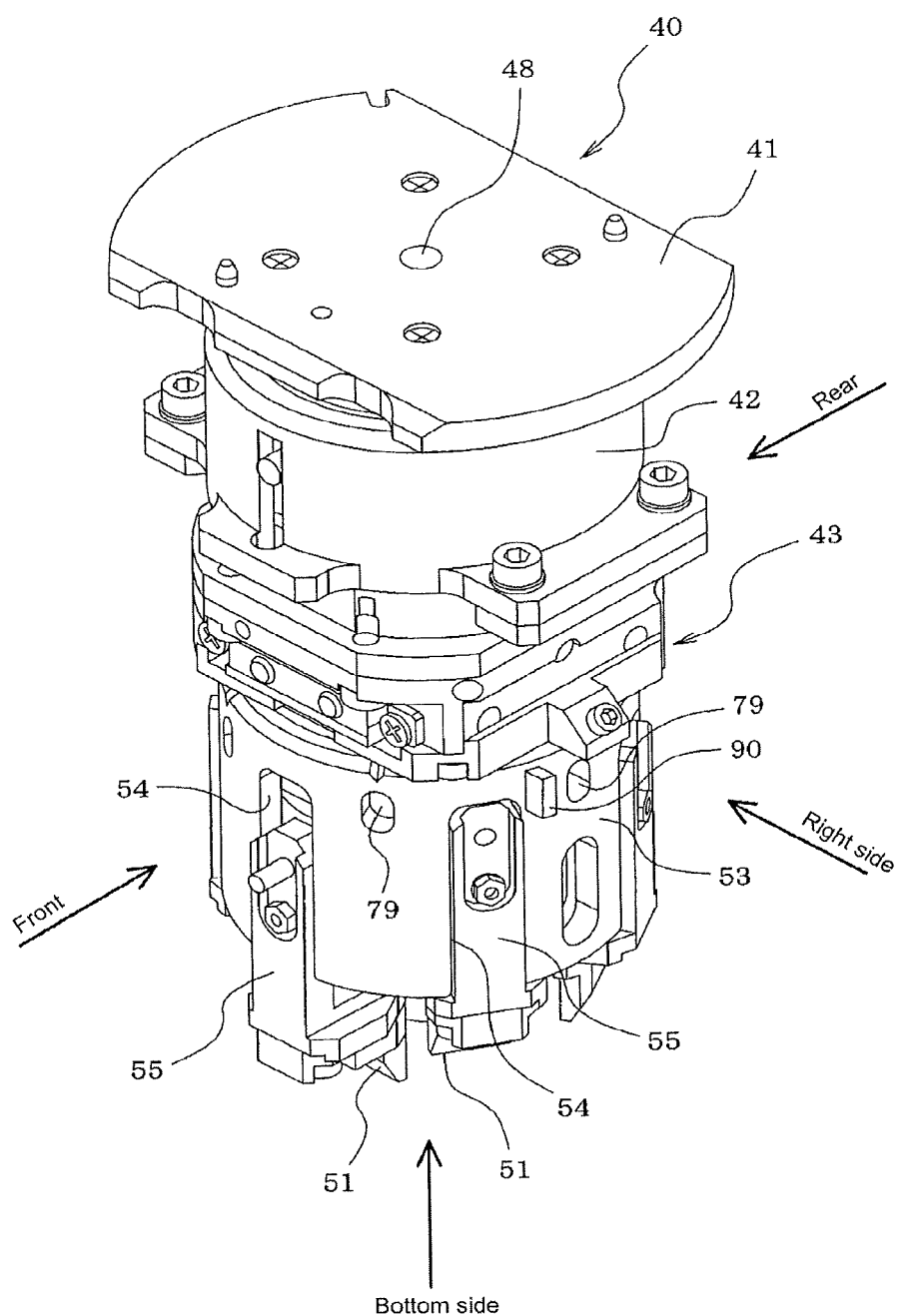
FIG. 3 is a perspective view of a chuck device.
Figure 4:
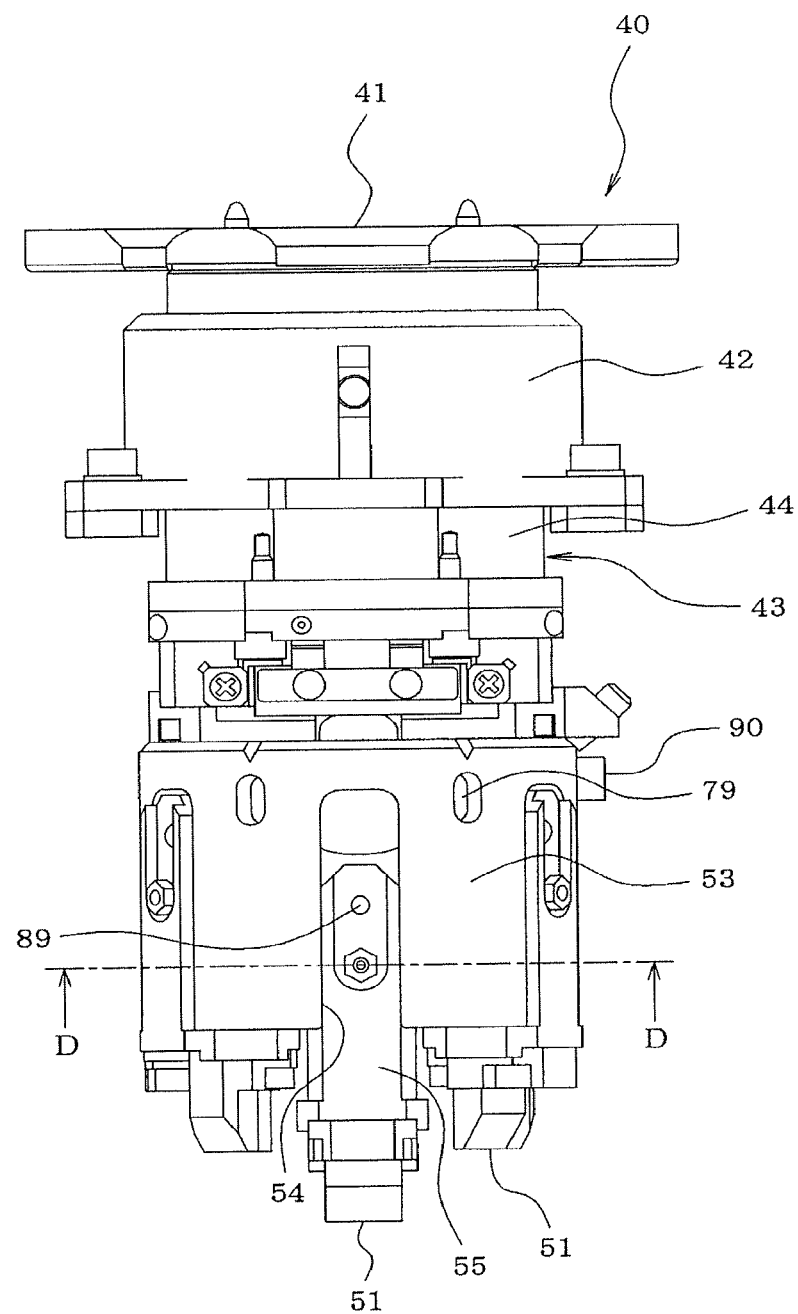
FIG. 4 is a front view of the chuck device.
Figure 5:
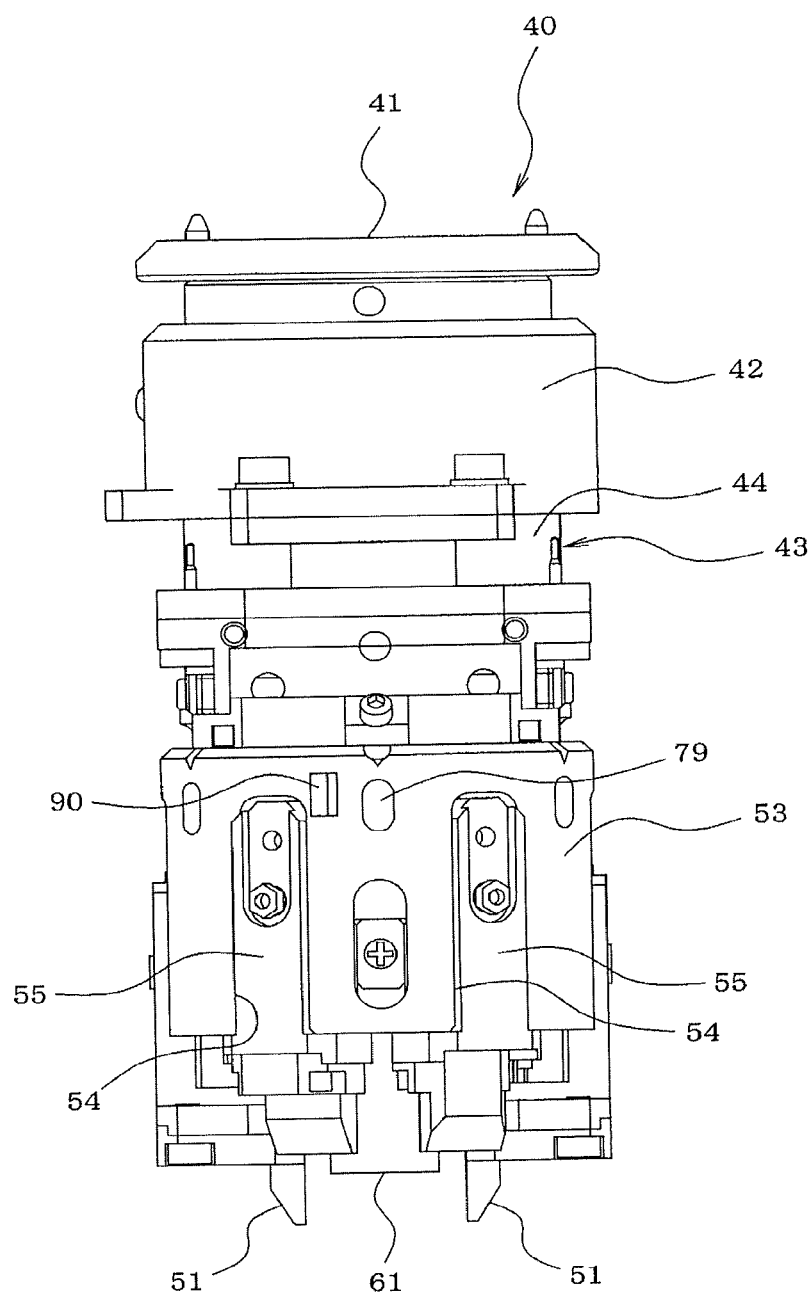
FIG. 5 is a right side view of the chuck device.
Figure 6:
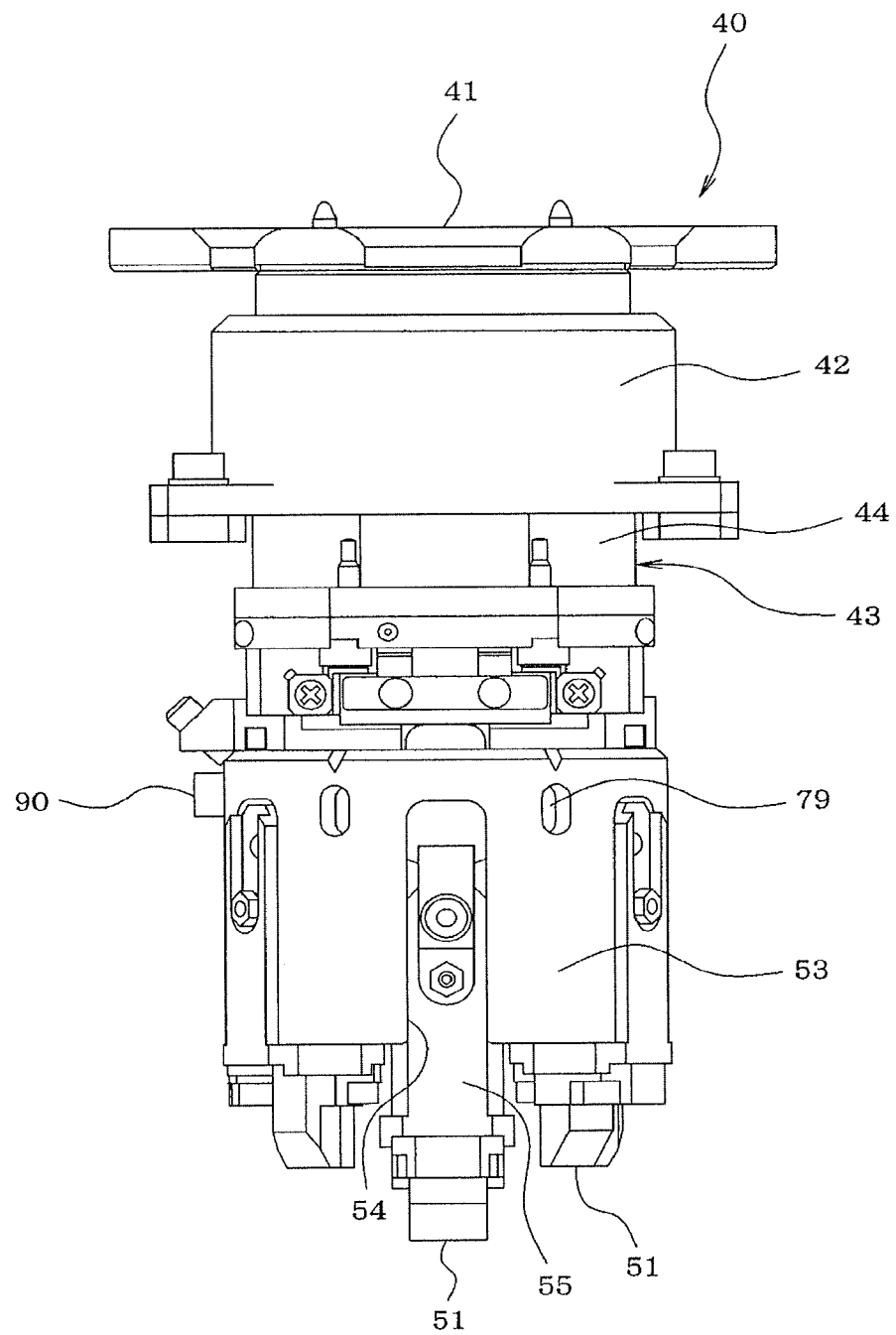
FIG. 6 is a rear view of the chuck device.
Figure 7:
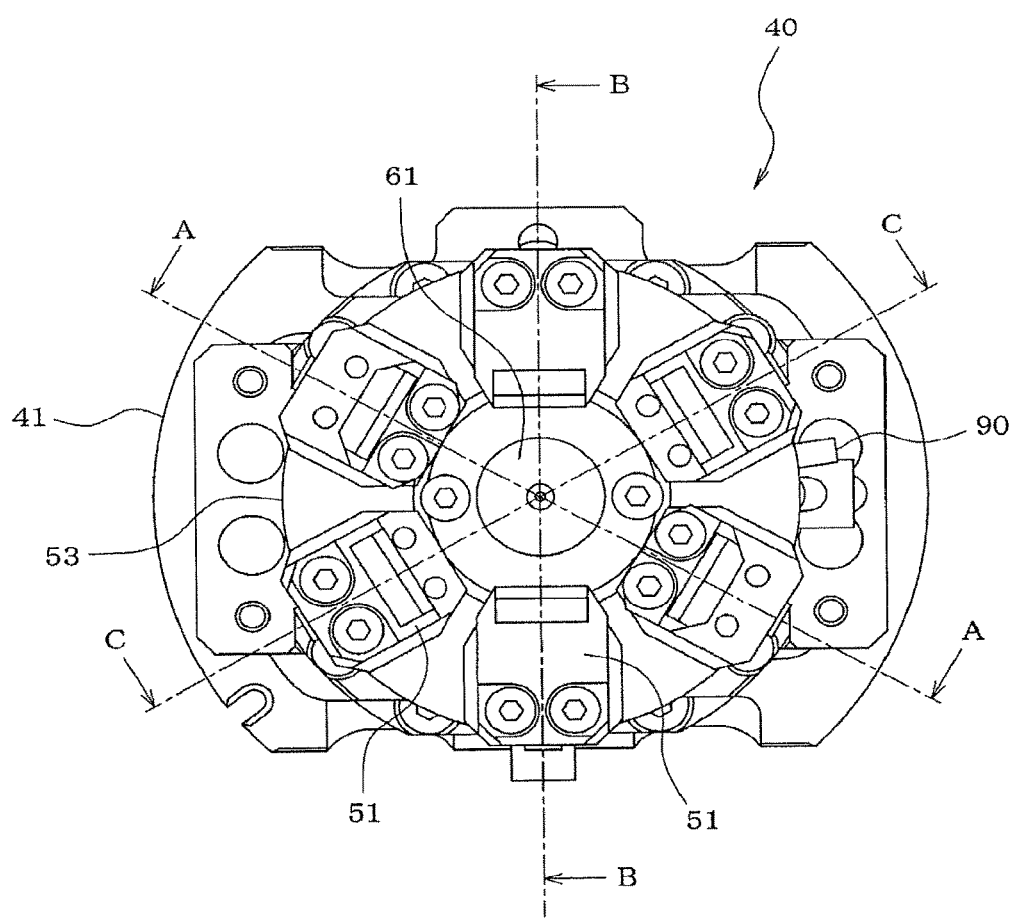
FIG. 7 is a bottom view of the chuck device.
Figure 8:
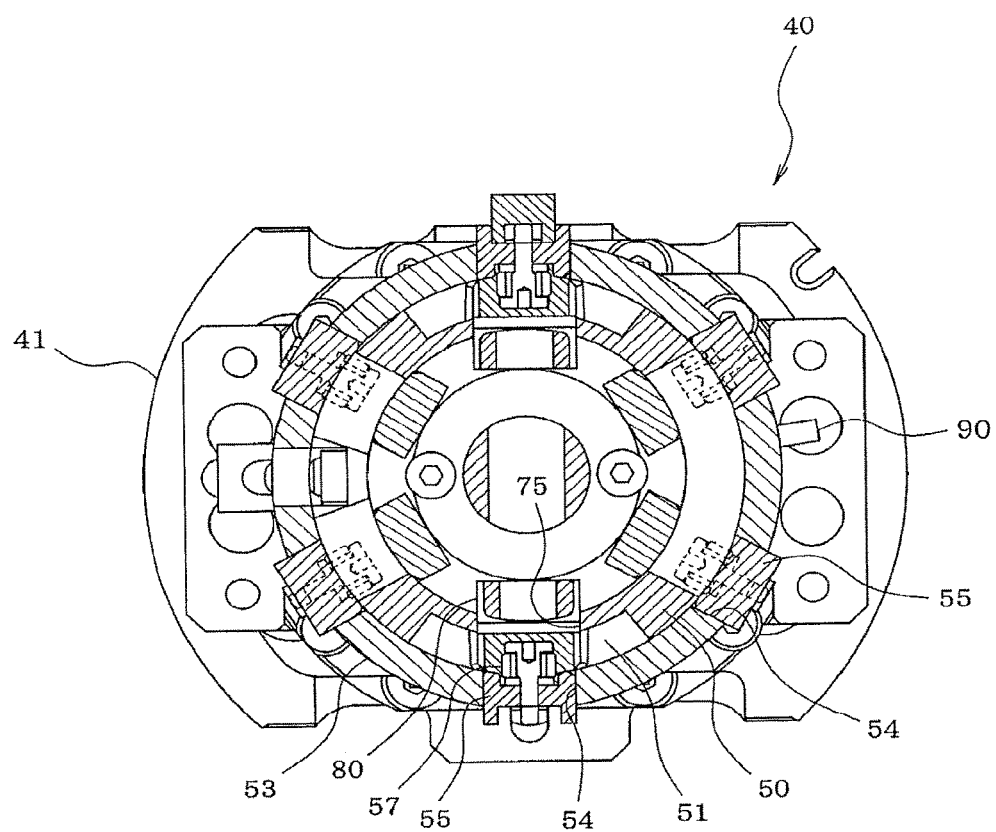
FIG. 8 is a cross-sectional view of the chuck device in FIG. 4 taken along line D-D.

The suction nozzle (not illustrated) that picks up a component which is supplied from component supply device 12 and chuck device 40 (refer to FIG. 3) that grabs, for example, a large component or a component with an unusual shape which is more difficult to pick up using a suction nozzle are interchangeably held by mounting head 14. Component imaging camera 17, which images the component held by the suction nozzle or chuck device 40 from below, is provided in component mounting machine 11. Mark imaging camera 18, which images a reference position mark of the circuit board and the like, is provided on mounting head 14.

Figure 2:
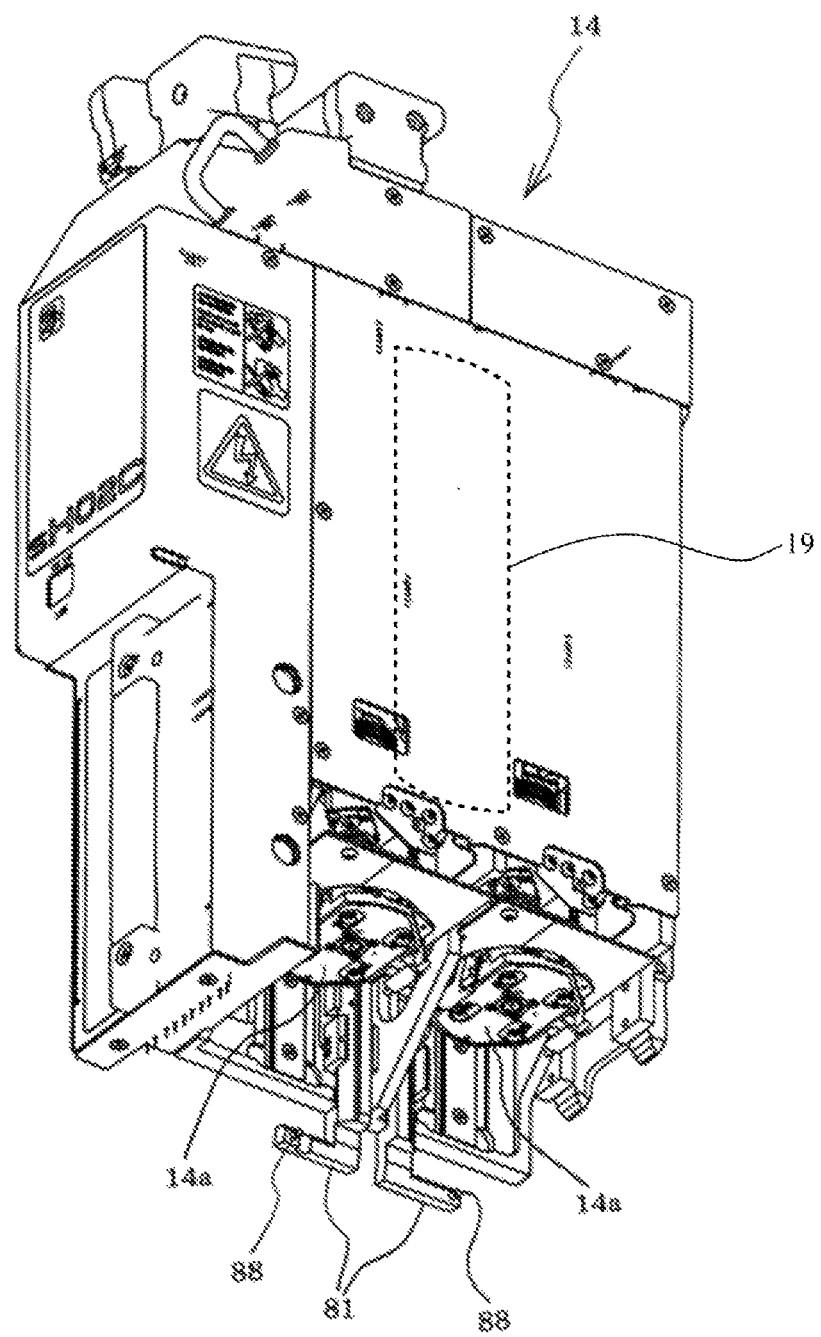
FIG. 2 is a perspective view of a mounting head.

Two Z-axis slides 23 and 24, which are individually driven by two Z-axis motors 21 and 22, are provided in mounting head 14. Each chuck device 40 is detachably held using negative pressure or the like on the lower side of each of the Z-axis slides 23 and 24 (refer to FIGS. 16 to 19). The chuck device 40 is moved upward and downward independently of each other by the respective Z-axis slides 23 and 24. A Q-axis (rotary shaft) 19, shown in FIG. 2, that rotates the chuck device 40 is assembled with each of the Z-axis slides 23 and 24.

X-axis slide mechanism 26 that has X-axis motor 25, which has a servomotor or the like as a driving source, and Y-axis slide mechanism 28 that has Y-axis motor 27, which has a linear motor or the like as a driving source, constitute XY-axis moving mechanism 15. X-axis slide mechanism 26 rotates X-axis ball screw 29 with X-axis motor 25 and moves an X-axis slide (not illustrated) on which mounting head 14 is mounted in the X-axis direction along X-axis guide 30. X-axis guide 30 is supported by Y-axis guide 31 of Y-axis slide mechanism 28 to be capable of sliding in the Y-axis direction, and X-axis guide 30 is connected to Y-axis slide 32 on which Y-axis motor 27 is mounted. In this manner, X-axis slide mechanism 26 is moved in the Y-axis direction along Y-axis guide 31 by Y-axis motor 27.

Figure 9:
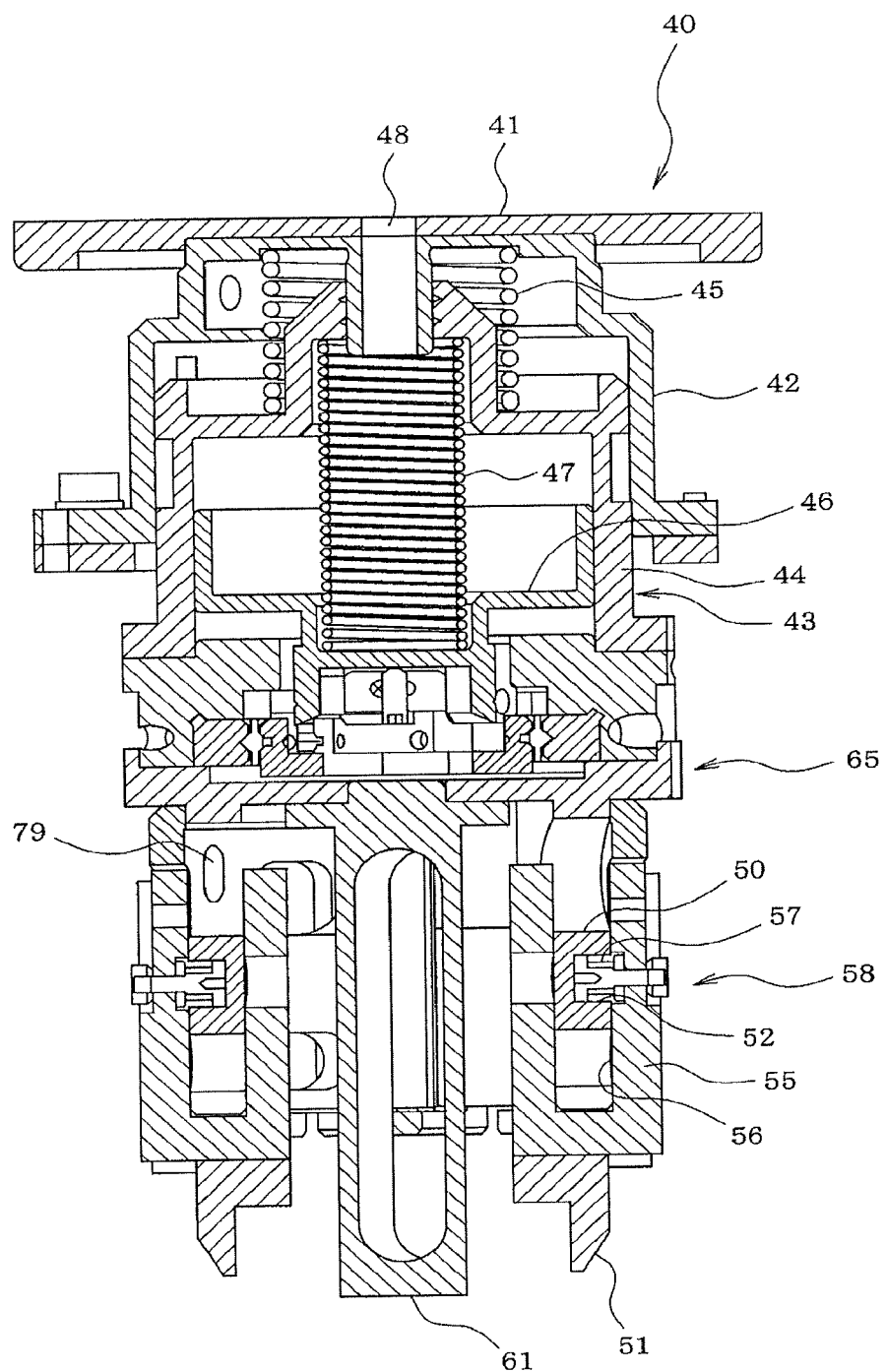
FIG. 9 is a cross-sectional view of the chuck device in FIG. 7 taken along line A-A.
Figure 10:
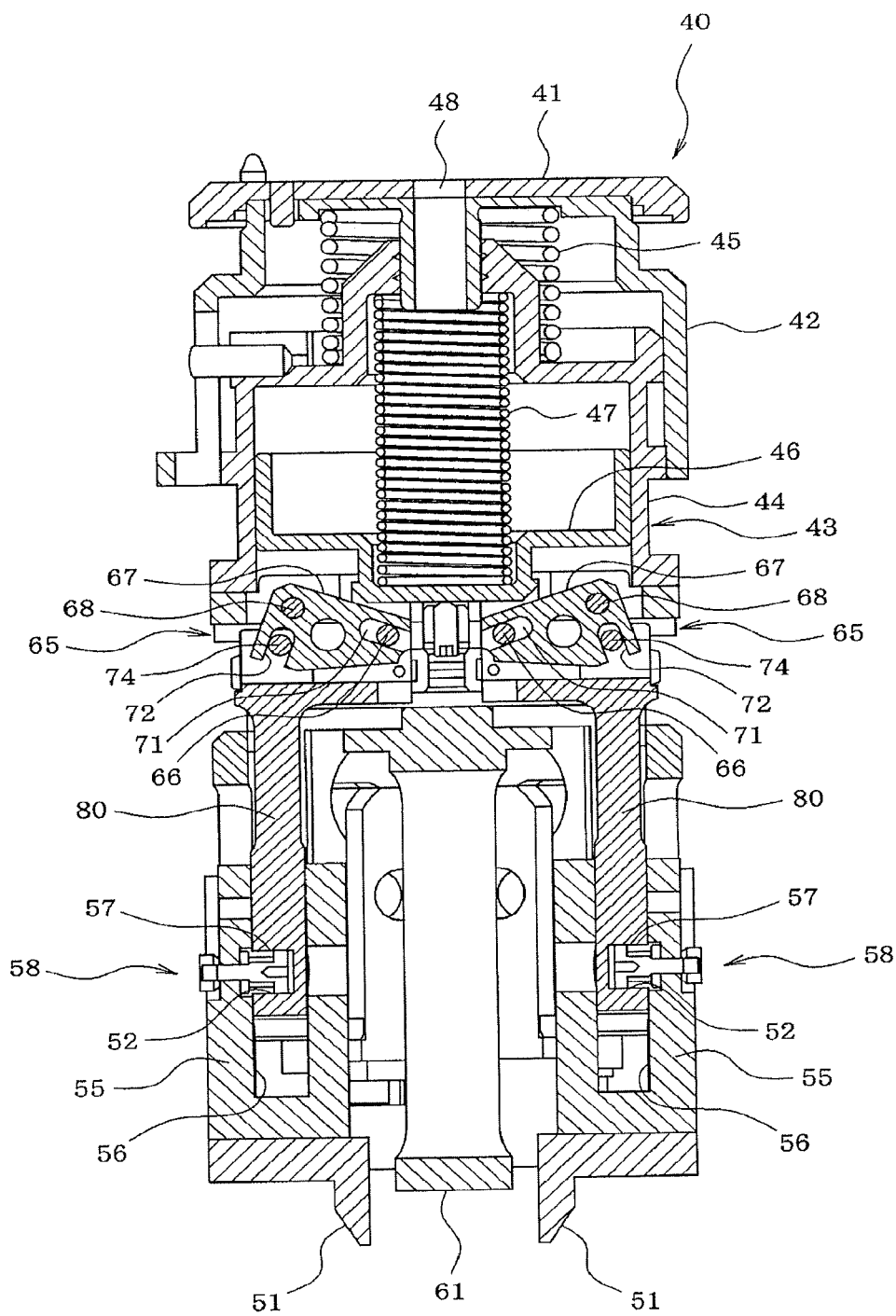
FIG. 10 is a cross-sectional view of the chuck device in FIG. 7 taken along line B-B.
Figure 11:
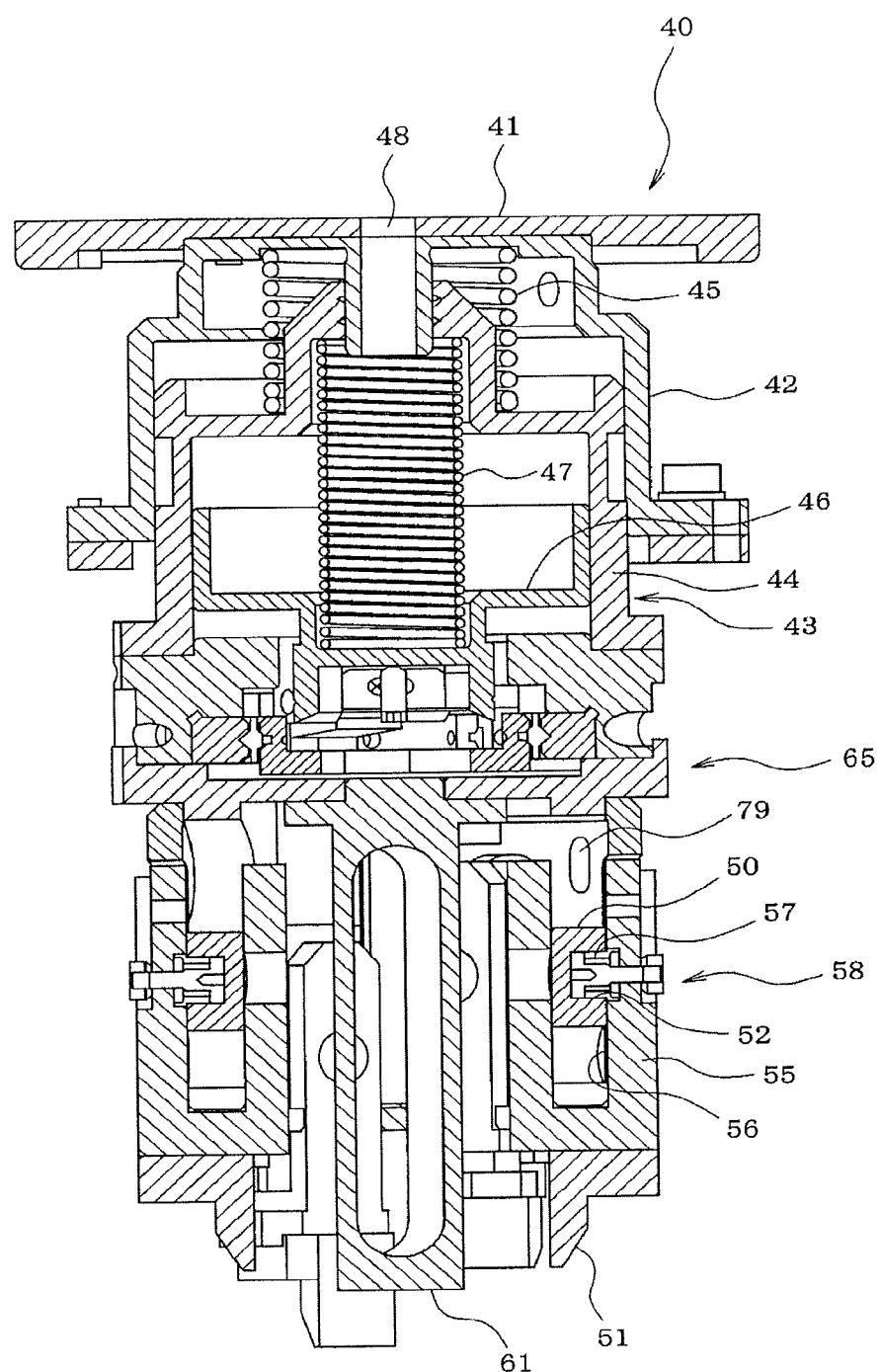
FIG. 11 is a cross-sectional view of the chuck device in FIG. 7 taken along line C-C.
Figure 12:
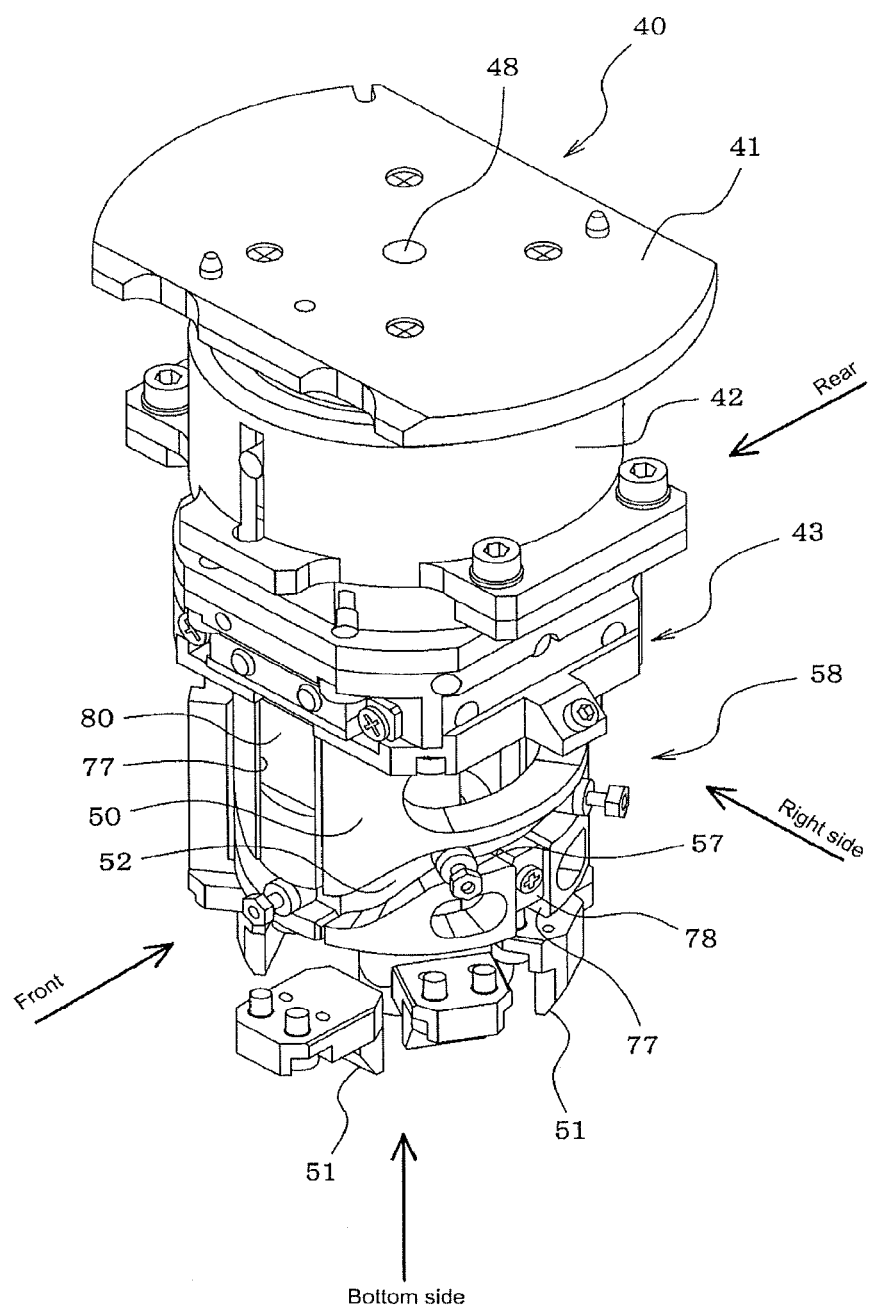
FIG. 12 is a perspective view illustrating a state where a tubular guide member and a claw holder have been removed from the chuck device.
Figure 13:
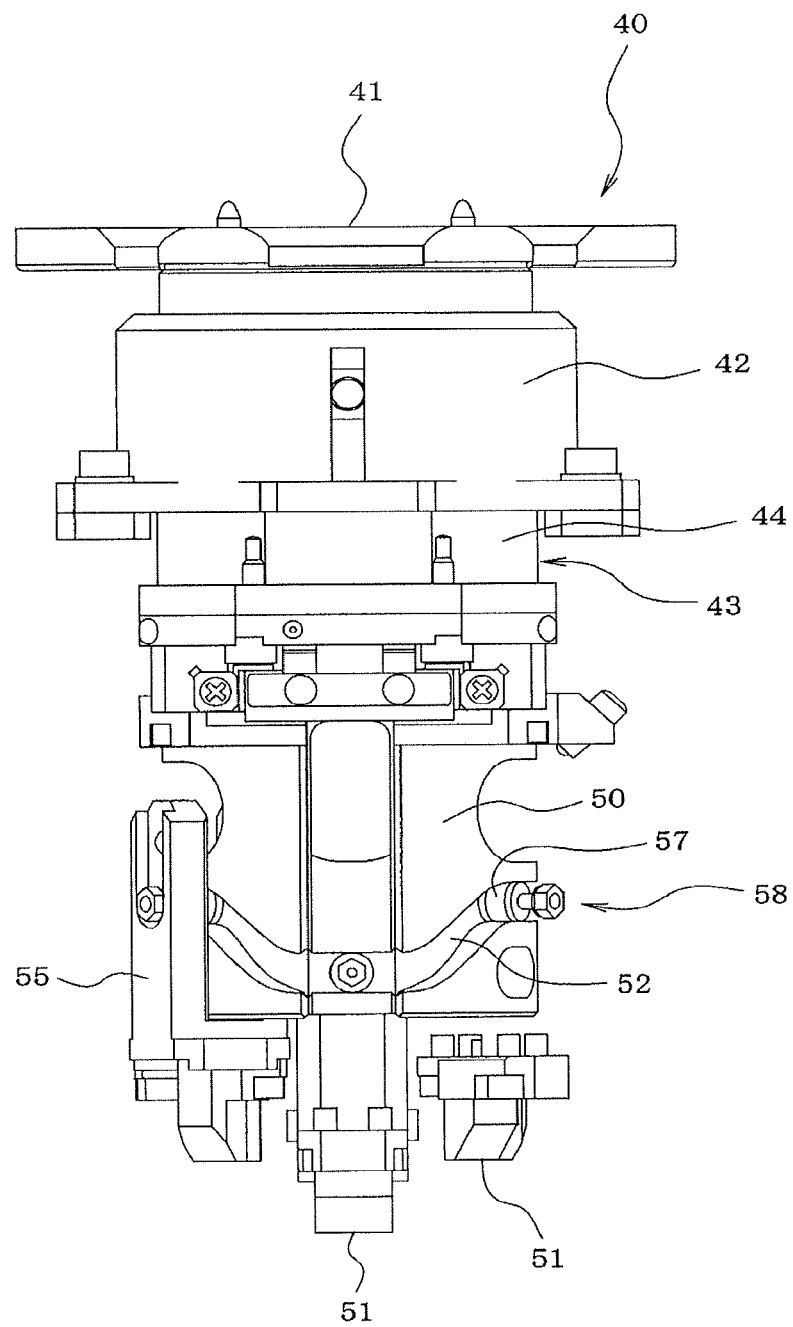
FIG. 13 is a front view of the chuck device that is illustrated in FIG. 12.
Figure 14:
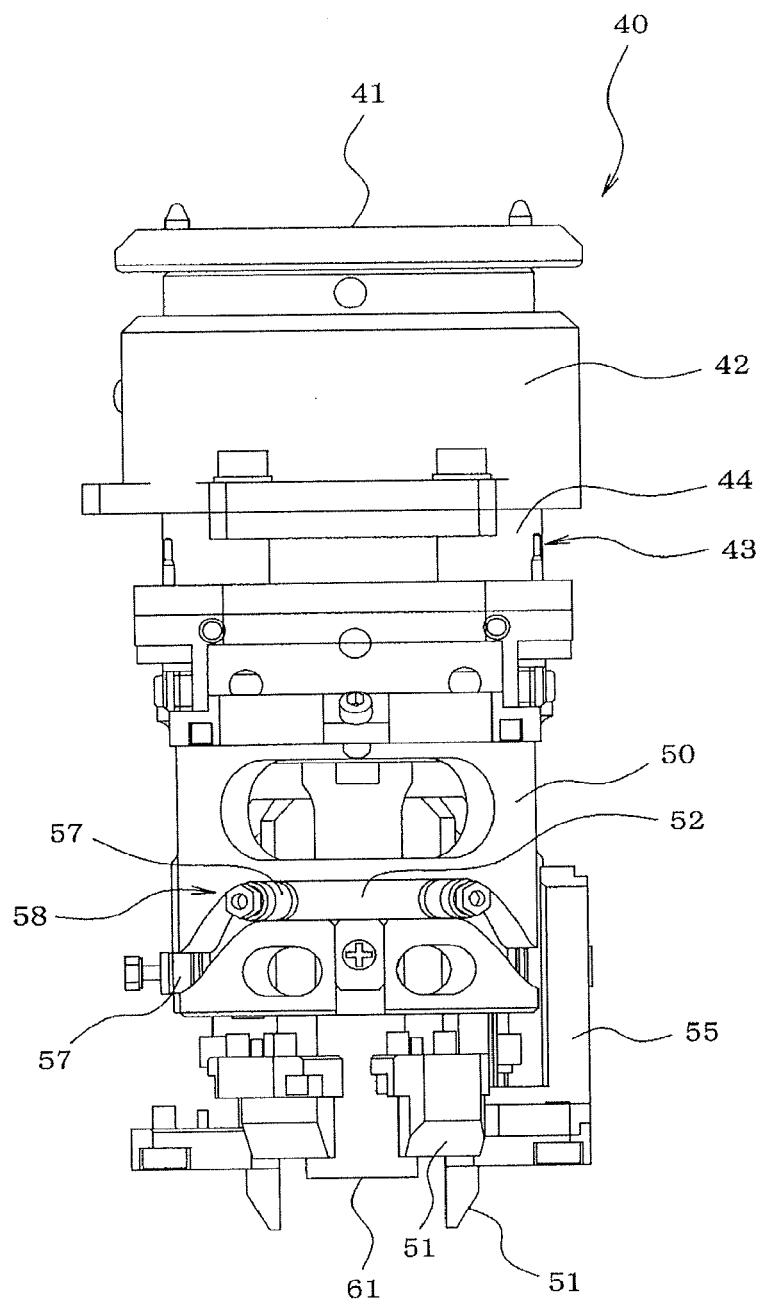
FIG. 14 is a right side view of the chuck device that is illustrated in FIG. 12.

Next, the configuration of chuck device 40 will be described with reference to FIGS. 3 to 15. Holding plate section 41, which is held with negative pressure or the like by connecting portion 14a (refer to FIG. 2) at a lower end of the Q-axis of mounting head 14, is provided at an upper end of chuck device 40. Cylindrical outer case 42 is fixed to a lower surface side of holding plate section 41. As illustrated in FIGS. 9 to 11, cylinder case 44 of air cylinder 43 is assembled inside outer case 42 to be capable of moving upward and downward, and this cylinder case 44 is biased downward by spring 45 (first biasing means).

Piston 46 is assembled in cylinder case 44 to be capable of moving upward and downward, and this piston 46 is biased downward by spring 47 (second biasing means). Air pressure introduction hole 48, which is connected to an air passage (not illustrated) of mounting head 14, is formed in holding plate section 41, and air pressure that is supplied through the air passage of mounting head 14 (negative pressure or positive pressure) is introduced into cylinder case 44 from air pressure introduction hole 48 (refer to FIGS. 9 to 11). When negative pressure is introduced into cylinder case 44, piston 46 is raised against the downwards force of suction spring 47 because of the suction force of the negative pressure. When positive pressure is introduced into cylinder case 44, piston 46 is pushed down by the positive air pressure and the downwards force of spring 47.

Cylindrical cam 50 is concentrically fixed on a lower side of cylinder case 44. Rotation of the Q-axis of mounting head 14 causes cylindrical cam 50 to rotate integrally with holding plate section 41, outer case 42, and cylinder case 44. Cam grooves 52 for moving a total of six (three pairs of) chuck claws 51 upward and downward are formed in an outer peripheral surface of cylindrical cam 50.

Tubular guide member 53 that guides the upward and downward movements of the respective chuck claws 51 is concentrically arranged on an outer peripheral side of cylindrical cam 50. An upper end portion of tubular guide member 53 is supported to be capable of rotating with respect to cylindrical cam 50. In tubular guide member 53, guide grooves (refer to FIG. 15) that guide the upward and downward movements of the respective chuck claws 51 are formed at regular intervals at a pitch of 60°.

Chuck claws 51 are interchangeably mounted by screwing or the like at respective lower ends of U-shaped claw holders 55. When clamping a component clamped with chuck claws 51, two (one pair) of the chuck claws 51 that are positioned in a diametrical direction of the chuck device 40 (diametrically opposite directions) are selected and used from the six (three pairs of) chuck claws 51 in accordance with the size and shape of the component. Accordingly, in a case where the number of chuck claws 51 that are assembled with the chuck device 40 is six in total as in this embodiment, three types (three pairs) of the chuck claws 51 that are different in size and shape are mounted.

Claw holders 55 are fitted into the respective guide grooves 54 of tubular guide member 53 to be capable of moving upward and downward. U-shaped grooves 56 of the respective claw holders 55 are fitted into cylindrical cam 50 to be capable of sliding in a rotational direction thereof. Cam followers 57 that are fixed to the respective claw holders 55 are fitted into cam grooves 52 in the outer peripheral surface of cylindrical cam 50. Accordingly, when cylindrical cam 50 is rotated in a state where rotation of tubular guide member 53 is locked, cam followers 57 of the respective claw holders 55 move upward and downward in response to upward and downward movements of cam grooves 52 of cylindrical cam 50 and the respective chuck claws 51 move upward and downward independently of each other.

Cam grooves 52 of cylindrical cam 50 are configured such that only the two (one pair) of the chuck claws 51 that are in use among the six (three pairs of) chuck claws 51 in total are lowered to a lowest position (clamping operation position) and protrude, and the four (two pairs of) chuck claws 51 that are not used are retracted to an uppermost position (retraction position) which does not interfere with clamping operation of the chuck claws 51 in use. The above-described cylindrical cam 50, cam followers 57, tubular guide member 53, and the like constitute chuck claw switching mechanism 58.

Height regulating member 61 for maintaining a constant height position of chuck claw 51 with respect to the clamped component is arranged at a central position of cylindrical cam 50. Accordingly, after a lower end of the height regulating member 61 abuts against an upper surface of the component during a lowering operation of chuck device 40, only holding plate section 41 and outer case 42 are lowered in response to the lowering operation of chuck device 40 and lowering of the other parts is forcibly stopped by spring 45 in an upper portion of chuck device 40 being compressed by height regulating member 61, and lowering of chuck claws 51 is forcibly stopped as well.

Hereinafter, a configuration of driving mechanism 65 that allows the two (one pair of) chuck claws 51 in use to perform the clamping operation will be described with reference to FIG. 10. Driving mechanism 65 has air cylinder 43 as a driving source, and two engaging pins 66 are fixed to both left and right sides of a lower surface side part of piston 46 of air cylinder 43. On both left and right sides of a lower surface side part of cylinder case 44, two pivoting levers 67 are supported to be capable of pivoting in a vertical direction via two shaft pins 68. U-shaped engaging grooves 71 and 72 are formed on both sides of each of the pivoting levers 67. Engaging pin 66 of piston 46 is slidably engaged with engaging groove 71 inside each of the pivoting levers 67. Accordingly, the two pivoting levers 67 pivot in the vertical direction by using the two shaft pins 68 as fulcrums in response to an upward and downward movement of piston 46.

Engaging grooves 72 on the outer sides of the two pivoting levers 67 are formed obliquely downward or downward, and two opening and closing levers 80 that are engaged with engaging grooves 72 of the two pivoting levers 67 are placed on both diametrical sides of cylindrical cam 50 in the diametrical direction. Engaging pins 74 that are disposed at respective upper ends of the opening and closing levers 80 are slidably engaged with engaging grooves 72 on the outer sides of the respective pivoting levers 67. Pivoting of the respective pivoting levers 67 causes the two opening and closing levers 80 to move in a diametrical direction of cylindrical cam 50.

Cutout grooves 75 (refer to FIG. 15) are formed on both of the diametrical sides of cylindrical cam 50, and the opening and closing levers 80 move into or out of respective cutout grooves 75. When both of the opening and closing levers 80 are open (when both of the chuck claws 51 are open), pivoting levers 67 cause outside surfaces of the respective opening and closing levers 80 to be held at a position substantially corresponding to the outer peripheral surface of cylindrical cam 50 and cam grooves 76 that are formed in lower portions of the respective opening and closing levers 80 become successive to cam grooves 52 of cylindrical cam 50. When both of the opening and closing levers 80 are closed (when both of the chuck claws 51 are closed), both of the opening and closing levers 80 are moved inside cylindrical cam 50 by the respective pivoting levers 67.

The two opening and closing levers 80 can be fitted into U-shaped grooves 56 of the two claw holders 55. In a state where the two opening and closing levers 80 are fitted into U-shaped grooves 56 of the two claw holders 55, the two opening and closing levers 80 are moved in the diametrical direction of cylindrical cam 50, and thus the two claw holders 55 are moved in the diametrical direction of cylindrical cam 50, the two chuck claws 51 fixed to the lower ends of the two claw holders 55 undergo an opening or closing operation, and the component is clamped with the two chuck claws 51 or released.

Figure 15:
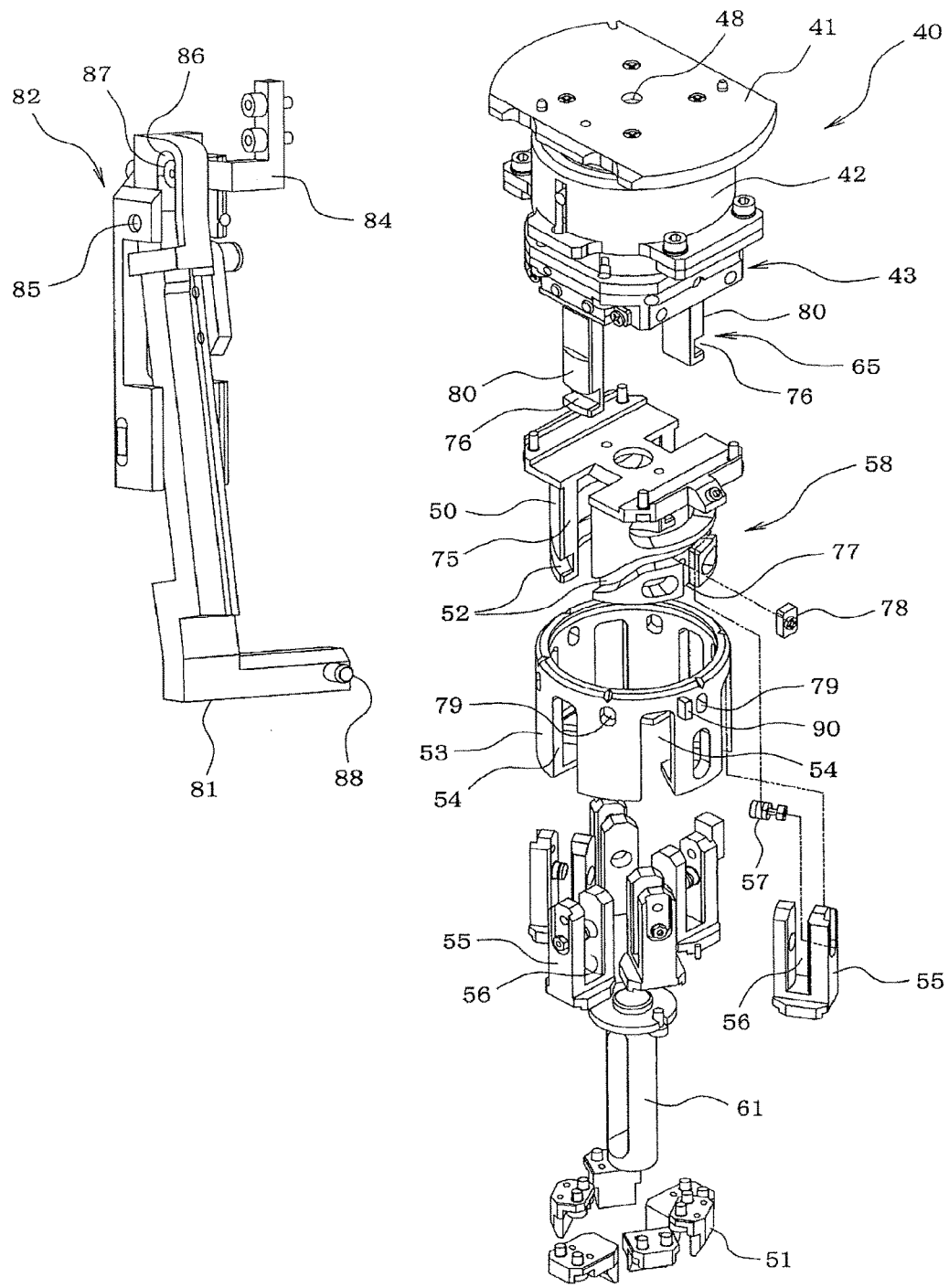
FIG. 15 is an exploded perspective view of the chuck device and a rotation locking member.
Figure 16:
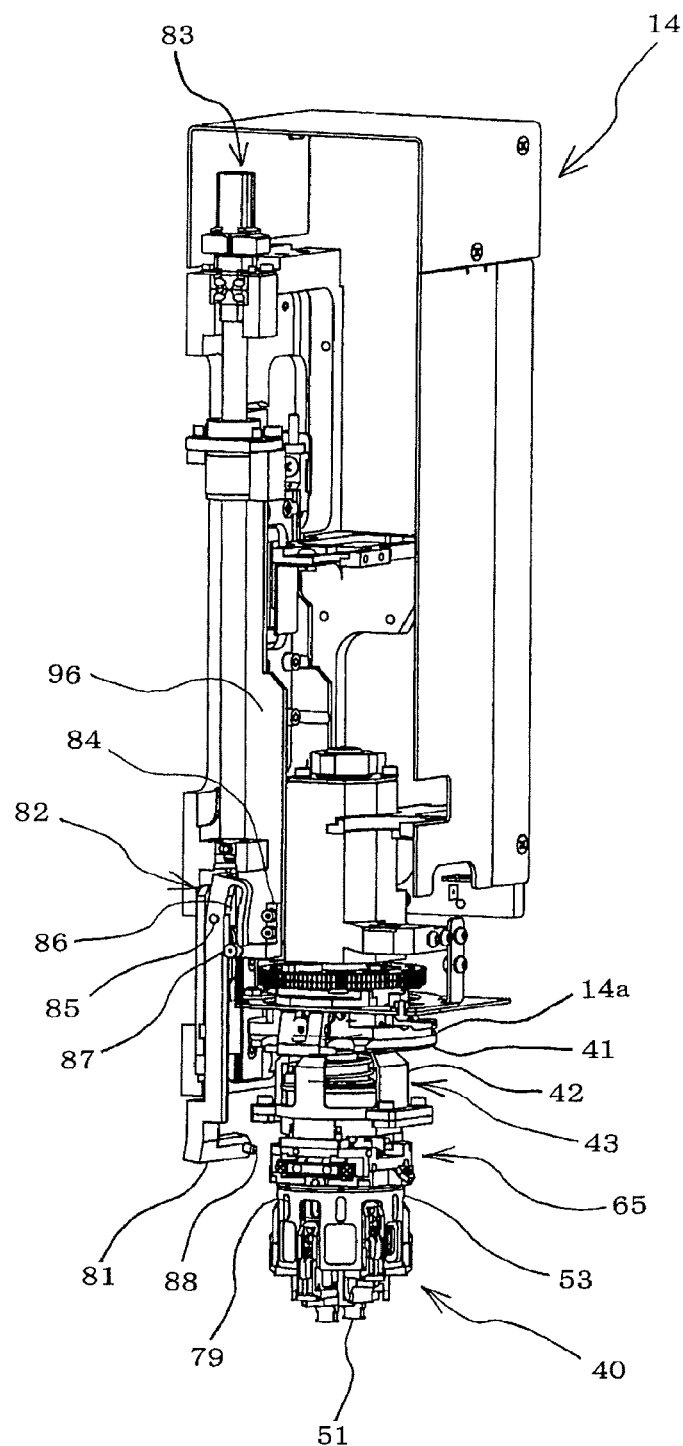
FIG. 16 is a perspective view illustrating the mounting head, the chuck device, the rotation locking member, and a rotation locking member moving mechanism.

As illustrated in FIG. 15, introduction grooves 77 that reach cam grooves 52 are formed to penetrate a lower portion of the outer peripheral surface of cylindrical cam 50 downward. During assembly of chuck device 40, cam follower 57 is introduced to cam groove 52 from introduction groove 77, and then obstruction piece 78 is fitted into introduction groove 77 and fixed by a screw or the like (refer to FIG. 12).

In addition, six lock holes 79 that lock the rotation of tubular guide member 53 during chuck claw switching operation are formed in tubular guide member 53 at a predetermined pitch (such as a pitch of 60°) and with a predetermined positional relationship with the six chuck claws 51. Furthermore, rotation stopper 90, which is used during a switching initialization operation (described later), is disposed at a predetermined position in an outer peripheral portion of tubular guide member 53.

As illustrated in FIGS. 15 to 19, rotation locking member 81 that locks the rotation of tubular guide member 53 during switching of chuck claws 51 in use, cam follower 87 that moves the rotation locking member 81 to and from a lock position at which the rotation of tubular guide member 53 is locked, an unlock position at which the locking is released, and a switching initialization position at which a switching state of chuck claw 51 returns to a certain state, and rotation locking member moving mechanism 82 that holds rotation locking member 81 in a movable manner via shaft 85 are provided at predetermined positions in mounting head 14 holding chuck device 40.

Cam follower 87 is mounted on a lower end portion of vertical slide member 96 via lifting and lowering member 84 and is configured to be moved in the vertical direction (Z-axis direction) by ball screw device 83. Cam groove 86 for converting a vertical displacement of lifting and lowering member 84 to a pivoting displacement is formed in an upper portion of rotation locking member 81, and cam follower 87 fixed to lifting and lowering member 84 is fitted into cam groove 86 of rotation locking member 81. Because of this configuration, vertical motion of ball screw device 83 is converted to rotary motion of rotation locking member 81.

Figure 17:
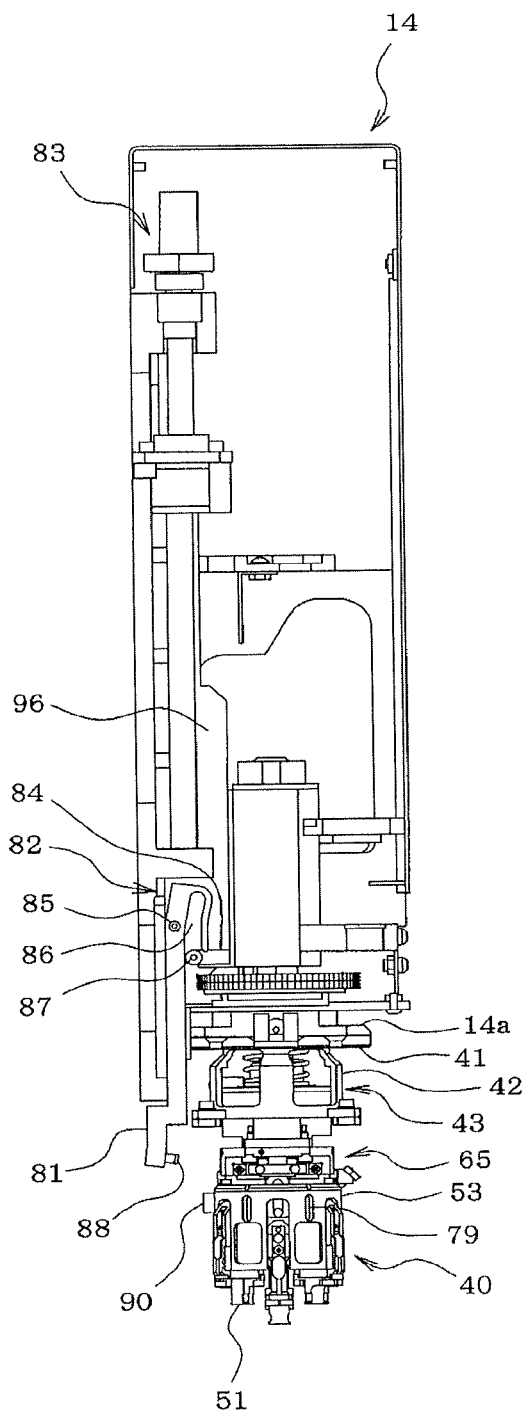
FIG. 17 is a side view illustrating a state at a time when the rotation locking member has moved to an unlock position.

As a result, as illustrated in FIG. 17, when lifting and lowering member 84 and cam follower 87 are lowered to or below a predetermined position in a range of upward and downward movement (this predetermined position being the unlock position) by ball screw device 83, in conjunction with that lowering, rotation locking member 81 rotates in a clockwise direction illustrated in FIG. 17 about shaft 85, and, lock pin 88 provided laterally in a lower portion of rotation locking member 81 is withdrawn from the lock hole 79 of tubular guide member 53 and the locking of the rotation of tubular guide member 53 is released. Once the Q-axis of mounting head 14 is rotated in this state, tubular guide member 53 rotates along with cylindrical cam 50 and chuck claw 51 turns, but chuck claw 51 used for the clamping operation is not switched.

Figure 18:
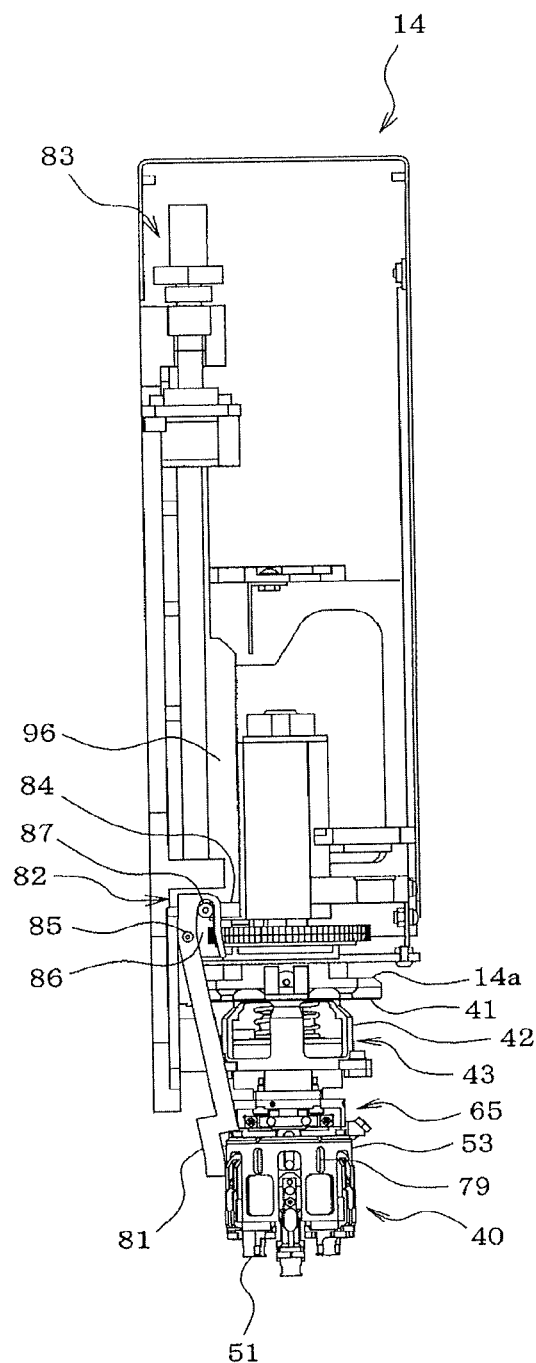
FIG. 18 is a side view illustrating a state at a time when the rotation locking member has moved to a lock position.

In addition, as illustrated in FIG. 18, when lifting and lowering member 84 and cam follower 87 are lifted to an upper limit position in the range of upward and downward movement (this upper limit position being the lock position) by ball screw device 83, rotation locking member 81 is pivoted in a counterclockwise direction illustrated in FIG. 18 about the shaft 85, and, lock pin 88 of rotation locking member 81 is fitted into lock hole 79 of tubular guide member 53 and rotation of tubular guide member 53 is locked. Once the Q-axis of mounting head 14 is rotated in this state, only cylindrical cam 50 inside tubular guide member 53 rotates in a state where the rotation of tubular guide member 53 is locked, and switching operation is performed on chuck claws 51 used for the clamping operation.

Figure 19:
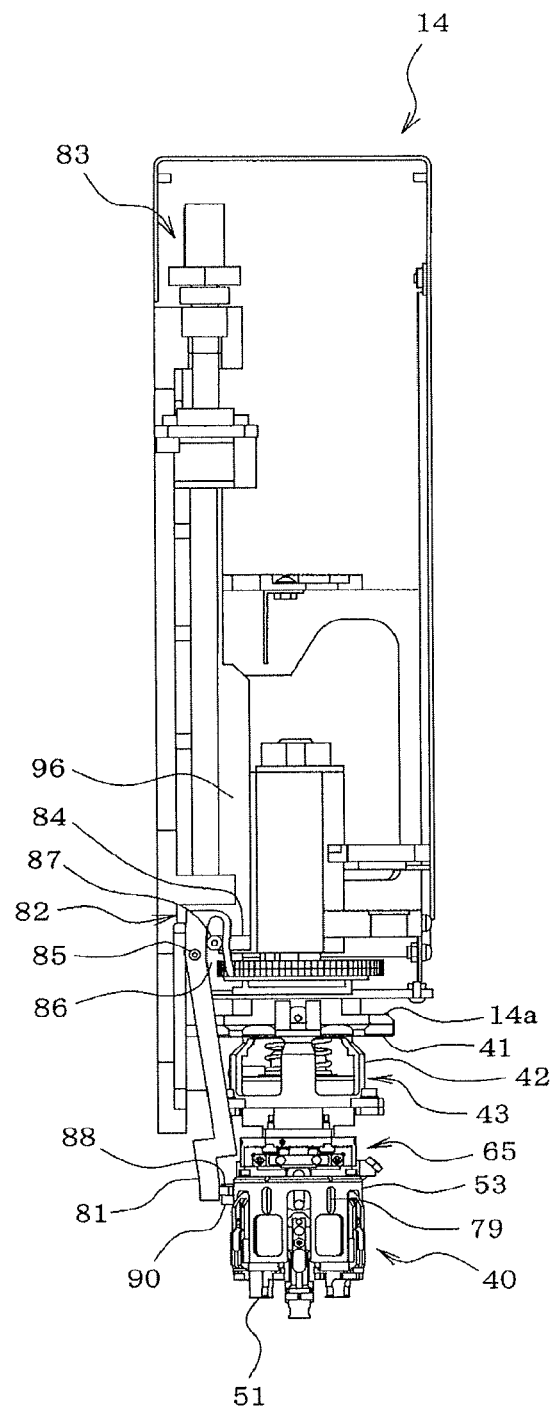
FIG. 19 is a side view illustrating a state at a time when the rotation locking member has moved to a switching initialization position.

In addition, as illustrated in FIG. 19, a movement of lifting and lowering member 84 and cam follower 87 to an intermediate position between the lock position and the unlock position (this intermediate position being the switching initialization position) by ball screw device 83 results in a state where lock pin 88 of rotation locking member 81 has moved into a turning region of rotation stopper 90 on an outer periphery of tubular guide member 53. Once the Q-axis of mounting head 14 is rotated in this state and tubular guide member 53 is rotated along with cylindrical cam 50, rotation stopper 90 hits against lock pin 88 soon and the rotation of tubular guide member 53 is stopped. When the Q-axis of mounting head 14 continues to rotate thereafter, only cylindrical cam rotates and the switching initialization operation (described later) is performed.

If rotation stopper 90 of tubular guide member 53 was already present at the switching initialization position to which lock pin 88 of rotation locking member 81 is to be moved at a time of the switching initialization operation, lock pin 88 might collide with rotation stopper 90 and its movement to the switching initialization position might become impossible, and then the switching initialization operation might fail or damage might be done to lock pin 88 or rotation stopper 90.

Figure 20:
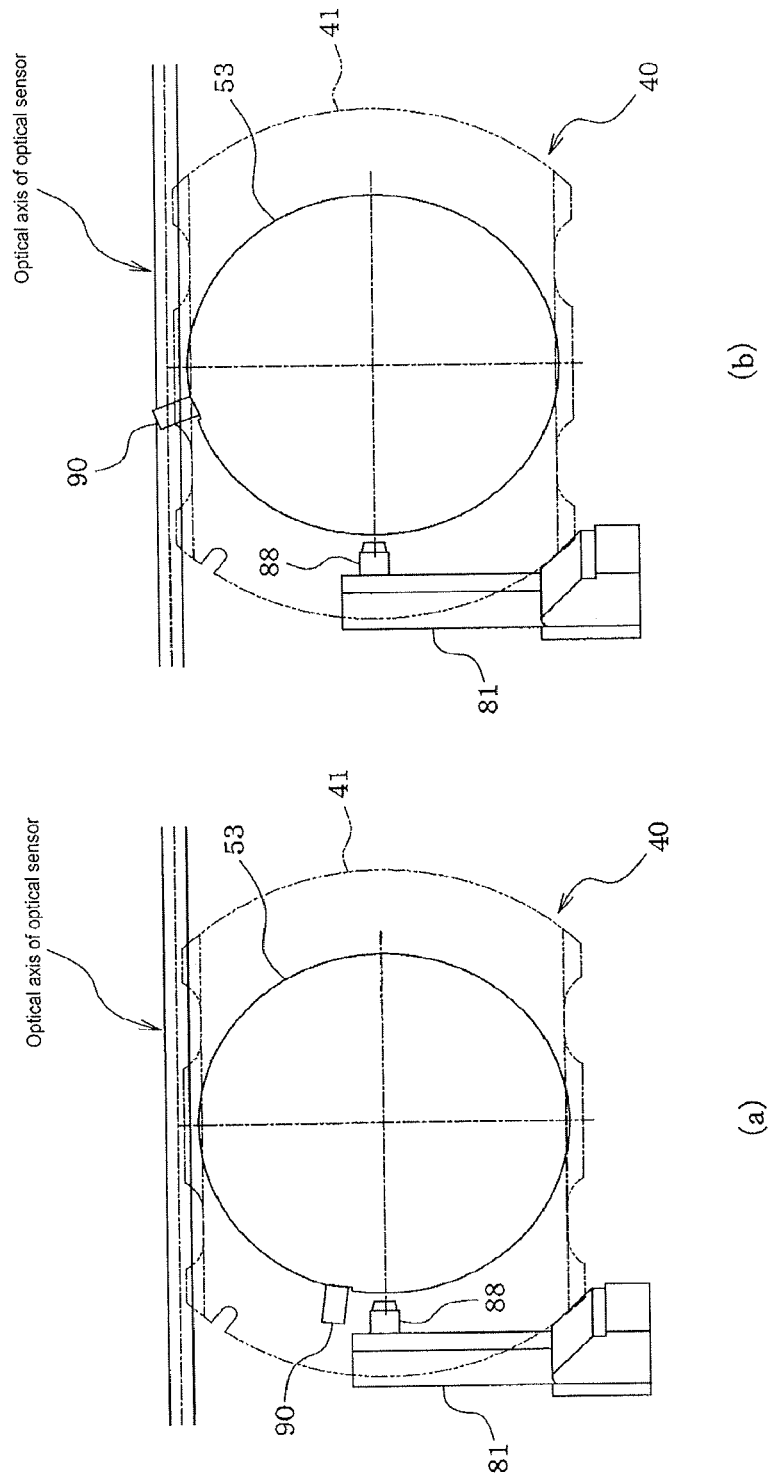
FIGS. 20A and 20B are bottom views showing a collision avoidance operation of a rotation stopper and the rotation locking member at a time when a switching initialization operation for returning a switching state of a chuck claw to a certain state is performed.

As a countermeasure, in this embodiment, before the movement of lock pin 88 of rotation locking member 81 to the switching initialization position, and after it is confirmed by a transmissive optical sensor 89 (refer to FIG. 1) installed in component mounting machine 11 and that the rotation stopper 90 of tubular guide member 53 is at a position where rotation stopper 90 of tubular guide member 53 does not collide with lock pin 88 of rotation locking member 81, rotation locking member 81 is subjected to pivoting toward the switching initialization position. Specifically, as illustrated in FIG. 20, optical sensor 89 is arranged such that an optical axis of optical sensor 89 is superposed on the turning region of rotation stopper 90 on the outer periphery of tubular guide member 53 at a position separated from lock pin 88 of rotation locking member 81, and before the movement of lock pin 88 of rotation locking member 81 toward the switching initialization position, rotation stopper 90 is turned by tubular guide member 53 being rotated based on the rotation of the Q-axis of mounting head 14 and, as illustrated in FIG. 20B, the rotation of tubular guide member 53 is stopped by the rotation of the Q-axis of mounting head 14 being stopped at a point in time when rotation stopper 90 is detected by optical sensor 89 due to rotation stopper 90 of tubular guide member 53 blocking the optical axis of optical sensor 89. Since lock pin 88 of rotation locking member 81 is moved toward the switching initialization position after the presence of rotation stopper 90 of tubular guide member 53 at a position separated from lock pin 88 of rotation locking member 81 is confirmed as described above, lock pin 88 of rotation locking member 81 does not collide with rotation stopper 90.

Figure 22:
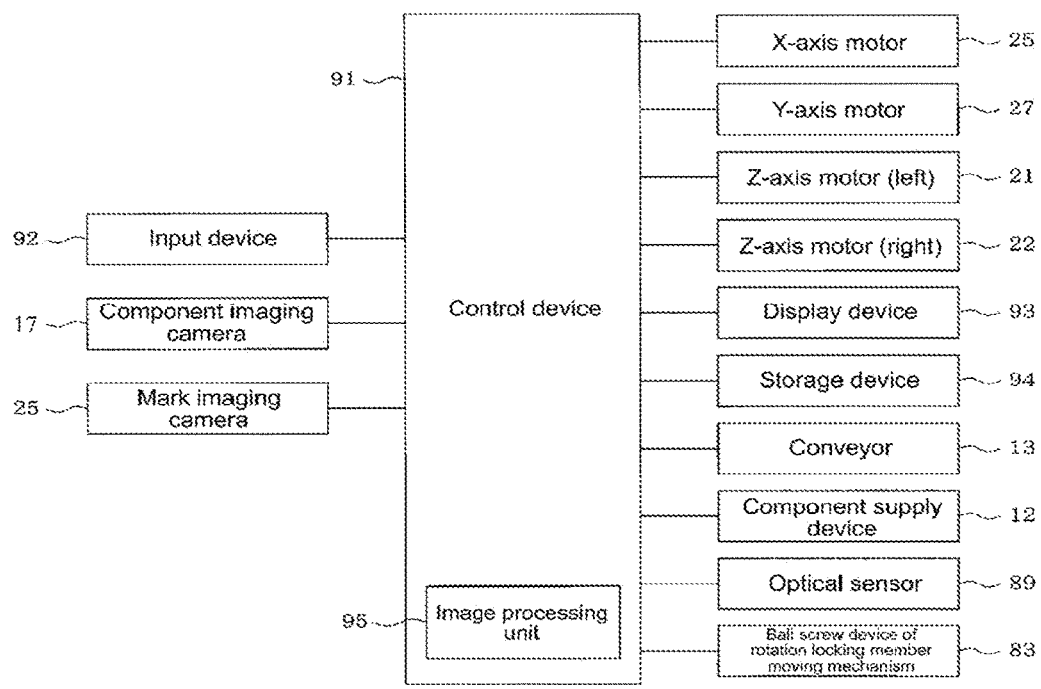
[FIG. 22 is a block diagram illustrating a configuration of a control system for the component mounting machine.

As illustrated in FIG. 22, control device 91 of component mounting machine 11 has a computer as a main component, and input device 92 such as a keyboard, a mouse, or a touch panel, display device 93 such as an LCD, an EL, or a CRT, storage device 94 storing various control programs and various types of data for controlling component mounting machine 11, and the like are connected to control device 91. In addition, image processing unit 95, which processes images captured by component imaging camera 17 and mark imaging camera 25, is built into control device 91.

Control device 91 controls operation for mounting components supplied from component supply device 12 on the circuit board while component mounting machine 11 is in operation by holding the component with chuck device 40 (or the suction nozzle). In addition, control device 91 controls the chuck claw switching operation, which is to switch the chuck claws 51 in use among the three pairs of chuck claws 51 assembled with chuck device 40 by using chuck claw switching mechanism 58 in accordance with the type of the component to be clamped, as follows.

In a case where the switching state of chuck claw 51 of chuck device 40 held by mounting head 14 is unclear, chuck device 40 is first moved to a position where the turning region of rotation stopper 90 is superposed on the optical axis of optical sensor 89 as illustrated in FIG. 20A and rotation stopper 90 is turned by tubular guide member 53 being rotated based on the rotation of the Q-axis of mounting head 14. Then, as illustrated in FIG. 20B, the rotation of tubular guide member 53 is stopped by the rotation of the Q-axis of mounting head 14 being stopped at a point in time when rotation stopper 90 is detected by optical sensor 89 with rotation stopper 90 blocking the optical axis of optical sensor 89. In this manner, rotation locking member 81 is moved toward the switching initialization position after it is confirmed that rotation stopper 90 of tubular guide member 53 is present at a position where rotation stopper 90 of tubular guide member 53 does not collide with lock pin 88 of rotation locking member 81.

Figure 21:
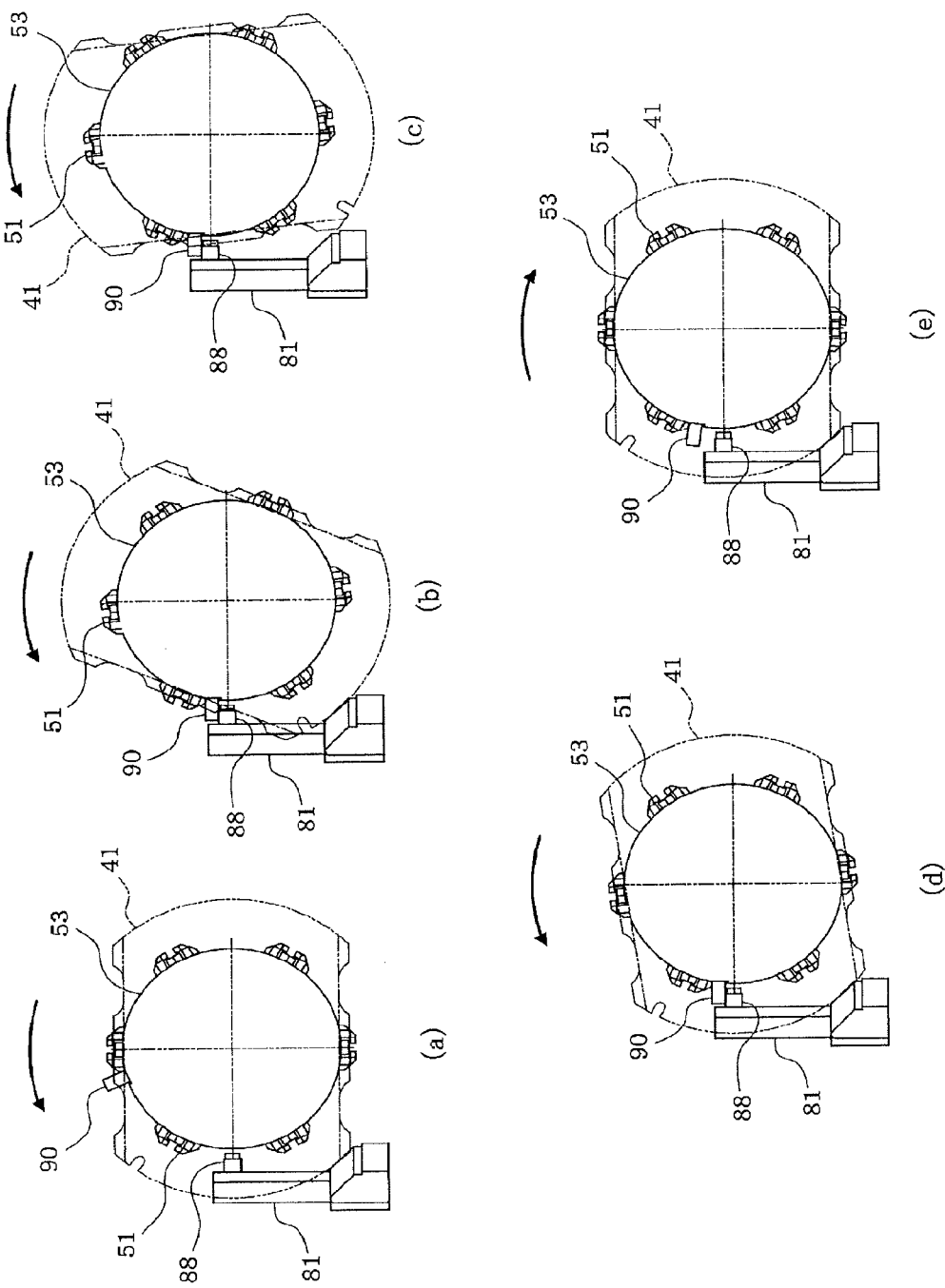
FIGS. 21A to 21E are bottom views showing the switching initialization operation.

Then, lifting and lowering member 84 and cam follower 87 are moved toward the switching initialization position by ball screw device 83 as illustrated in FIGS. 19 and 21 and a state is achieved where lock pin 88 of rotation locking member 81 has moved into the turning region of rotation stopper 90 on the outer periphery of tubular guide member 53. Then, the Q-axis of mounting head 14 is rotated by a predetermined angle of at least 360° (360°+α°) and chuck device 40 is rotated by a predetermined angle of at least 360° (360°+α°). At this time, tubular guide member 53 rotates along with cylindrical cam 50 until rotation stopper 90 hit against lock pin 88 as illustrated in FIG. 21B while the rotation of tubular guide member 53 is stopped and only cylindrical cam 50 inside tubular guide member 53 rotates as illustrated in FIGS. 21C and 21D after rotation stopper 90 hits against lock pin 88. The rotational direction is reversed with cylindrical cam 50 having rotated by the predetermined angle (360°+α°) as described above, and then the Q-axis of mounting head 14 is subjected to a reverse rotation by a certain angle (such as α°) as illustrated in FIG. 21E. Then, tubular guide member 53 is subjected to a reverse rotation by the certain angle (such as α°) along with cylindrical cam 50, and a state is resumed where rotation stopper 90 is separated from lock pin 88 and rotation stopper 90 and lock pin 88 do not interfere with each other.

As a result of this switching initialization operation, the relationship between the rotation angle of tubular guide member 53 and the rotation angle of cylindrical cam 50 can return to the certain state that is illustrated in FIG. 21E at all times, and thus the switching state of chuck claw 51 can return to the certain state at all times.

Then, lifting and lowering member 84 and cam follower 87 are lifted to the lock position by ball screw device 83 as illustrated in FIG. 18, lock pin 88 of rotation locking member 81 is fitted into lock hole 79 of tubular guide member 53, and a state is achieved where the rotation of tubular guide member 53 is locked. Cylindrical cam 50 of chuck device 40 is rotated by the Q-axis of mounting head 14 being rotated in this state. Then, cam followers 57 of the respective claw holders 55 move upward and downward in response to the upward and downward movements of cam grooves 52 of cylindrical cam 50 and the respective chuck claws 51 move upward and downward independently of each other.

When cylindrical cam 50 is rotated by 60° in a state where any one pair of chuck claws 51 of the three pairs of chuck claws 51 of chuck device 40 are lowered to the lowest position, at this time, the one pair of chuck claws 51 are lifted from the lowest position to the uppermost position and a pair of chuck claws 51 adjacent thereto are lowered to the lowest position. Accordingly, cylindrical cam 50 is rotated until the one pair of chuck claws 51 in use are lowered to the lowermost position.

Among the three pairs of chuck claws 51 assembled with chuck device 40, the one pair of chuck claws 51 used in accordance with the type of the component to be clamped are lowered to the lowest position as described above, and then the locking of the rotation of tubular guide member 53 is released by lifting and lowering member 84 and cam follower 87 being lowered to or below the unlock position by ball screw device 83 as illustrated in FIG. 17 and lock pin 88 of rotation locking member 81 being withdrawn from lock hole 79 of tubular guide member 53. Once the Q-axis of mounting head 14 is rotated in this state, tubular guide member 53 rotates along with cylindrical cam 50 and chuck claw 51 turns, but the chuck claw 51 used for the clamping operation is not switched.

Control device 91 does not have to confirm the switching state of chuck claw 51 in a case where the switching state of chuck claw 51 is already known before the chuck claw switching operation is initiated. Accordingly, in this case, the chuck claw switching operation is initiated immediately with the switching initialization operation described above omitted.

In this embodiment described above, multiple types of chuck claws 51 are provided in a single chuck device 40 and the chuck claws 51 in use are switched by chuck claw switching mechanism 58 in accordance with the type of the component to be clamped, and thus multiple types of components that are different in size and shape can be clamped by the single chuck device 40. Accordingly, the frequency with which chuck device 40 is replaced in accordance with the size and shape of the component to be clamped can be significantly reduced and productivity can be improved. In addition, significantly fewer types of chuck devices 40 are required to be prepared, which results in device cost reduction.

In this embodiment, chuck claw switching mechanism 58 is configured to lift chuck claws 51 not used among the multiple types of chuck claws 51 to the retraction position not interfering with the clamping operation of the chuck claws 51 in use, and thus an operation similar to that performed by a conventional chuck device provided with only one type of chuck claw can be performed by the chuck device 40 provided with the multiple types of chuck claws 51. Accordingly, ease of control is ensured.

This embodiment is configured such that cylindrical cam 50 is used to constitute chuck claw switching mechanism 58, the multiple types of chuck claws 51 are arranged at predetermined intervals around cylindrical cam 50, cam followers 57 provided at the respective chuck claws 51 are fitted into cam grooves 52 in the outer peripheral surface of cylindrical cam 50, tubular guide member 53 is provided concentrically on the outer peripheral side of cylindrical cam 50 to guide the upward and downward movement of each of the chuck claws 51, and the respective chuck claws 51 are moved upward and downward independently of each other by cylindrical cam 50 being rotated in a state where the rotation of tubular guide member 53 is locked during the switching of the chuck claw 51 in use, and thus the respective chuck claws 51 can be moved upward and downward independently of each other and the chuck claw 51 in use can be switched based on a relatively simple configuration.

In chuck device 40 according to this embodiment, the rotation of tubular guide member 53 needs to be locked during the switching of chuck claw 51 in use. According to the chuck device disclosed in the description of PCT/JP2013/077250, which was previously filed by the present applicant, a rotation locking member that locks rotation of a tubular guide member is provided in a chuck claw switching area in a component mounting machine and the rotation of the tubular guide member is locked by the rotation locking member by the chuck device held by a mounting head being moved toward the chuck claw switching area by a movement of the mounting head during switching of a chuck claw in use. In this configuration, however, the chuck device held by the mounting head needs to be moved to the chuck claw switching area in the component mounting machine by the movement of the mounting head during the switching of the chuck claw in use and, as such, a chuck claw switching operation takes time and a drawback arises in the form of an increase in takt time.

However, in this embodiment, rotation locking member 81 and rotation locking member moving mechanism 82 are provided in the mounting head 14, and thus rotation locking member 81 can be moved to the lock position by rotation locking member moving mechanism 82 and the rotation of tubular guide member 53 can be locked regardless of the position of chuck device 40 held by mounting head 14. Accordingly, chuck device 40 does not have to be moved to the chuck claw switching area in component mounting machine 11 during the switching of the chuck claw 51 in use, and the switching operation of the chuck claw 51 can be performed at any time so long as a component is not clamped, such as when returning to a component supply position after the component clamped by chuck device 40 has been mounted on the circuit board or the like, and may also be performed in parallel with other operations. Accordingly, an increase in takt time attributable to the switching operation of chuck claw 51 can be prevented.

In this embodiment, the multiple lock holes 79 that have a predetermined positional relationship with the multiple types of chuck claws 51 are formed in tubular guide member 53, and the rotation of tubular guide member 53 is locked with rotation locking member 81 being fitted into any one of the multiple lock holes 79 by rotation locking member 81 being moved to the lock position even in a state where any one of the multiple types of chuck claws 51 has been lowered to the clamping operation position, and thus tubular guide member 53 does not have to be rotated when the rotation of tubular guide member 53 is locked by rotation locking member 81 and the rotation of tubular guide member 53 can be simply locked with rotation locking member 81.

However, there may be cases in which an operator manually grabs and rotates tubular guide member 53 while, for example, component mounting machine 11 remains stopped, resulting in chuck claw 51 being switched and the switching state of the chuck claws 51 becoming unclear.

As a countermeasure, rotation locking member moving mechanism 82 is configured such that rotation locking member 81 can be moved to not only the lock position and the unlock position but also the switching initialization position at which the switching state of chuck claw 51 returns to the certain state through the switching initialization operation, rotation stopper 90 is disposed in the outer peripheral portion of tubular guide member 53, tubular guide member 53 is rotated along with cylindrical cam 50 by the Q-axis of mounting head 14 being rotated in a state where rotation locking member 81 has been moved to the switching initialization position by rotation locking member moving mechanism 82, the rotation of tubular guide member 53 is stopped by rotation stopper 90 hitting against rotation locking member 81 during the rotation, and the switching state of chuck claw 51 is returned to the certain state by cylindrical cam 50 being rotated to a certain position with the Q-axis of mounting head 14 continuing to rotate thereafter, and thus the relationship between the rotation angle of tubular guide member 53 and the rotation angle of cylindrical cam 50 can be returned to the certain state through the switching initialization operation and the switching state of chuck claw 51 can be returned to the certain state.

In this embodiment, the air pressure is supplied to air cylinder 43 of chuck device 40 through the air passage of mounting head 14 of component mounting machine 11, and thus the chuck claws 51 of chuck device 40 can be made to perform the clamping operation using an existing air circuit of component mounting machine 11. The present disclosure, however, may use an electrical actuator (such as a motor and a solenoid) as the driving source for the clamping operation of the chuck claw.

In this embodiment, chuck claws 51 are moved upward and downward independently of each other by cylindrical cam 50 of chuck device 40 being rotated based on the rotation of the Q-axis of mounting head 14, and thus the switching operation of chuck claw switching mechanism 58 can be performed by the use of the existing Q-axis of mounting head 14 of component mounting machine 11. The present disclosure, however, may use an electrical actuator (such as a motor and a solenoid) as the driving source for the chuck claw switching mechanism.

In this embodiment, two chuck devices 40 are held by mounting head 14 of component mounting machine 11, and thus the chuck claw switching operations of the two chuck devices 40 can be performed at the same time with the single mounting head 14 and the chuck claw switching operations of the two chuck devices 40 can be efficiently performed in a period of time equivalent to the chuck claw switching operation of the single chuck device 40.

It is a matter of course that the present disclosure may also be configured such that three or more chuck devices 40 are held by a single mounting head 14 or may also be configured such that only one chuck device 40 is held by the single mounting head 14.

Although ball screw device 83 is used as a driving source for rotation locking member moving mechanism 82 in the present disclosure, another actuator such as an air cylinder may be used instead.

The present disclosure is not limited to the configuration of the above-described embodiment, and it is a matter of course that the present disclosure can be modified in diverse forms without departing from the scope of the present disclosure. For example, the configuration of the chuck claw switching mechanism, the configuration of the driving mechanism for the clamping operation of the chuck claws, and the configuration of the rotation locking member moving mechanism may be appropriately changed, and the number of the chuck claws assembled with the chuck device may be appropriately changed.

REFERENCE SIGNS LIST

11: component mounting machine; 12: component supply device; 13: conveyor; 14: mounting head; 15: XY-axis moving mechanism; 17: component imaging camera; 18: mark imaging camera; 21, 22: Z-axis motor; 23, 24: Z-axis slide; 25: X-axis motor; 26: X-axis slide mechanism; 27: Y-axis motor; 28: Y-axis slide mechanism; 40: chuck device; 41: holding plate section; 43: air cylinder; 45: spring (first biasing means); 46: piston; 47: spring (second biasing means); 48: air pressure introduction hole; 50: cylindrical cam; 51: chuck claw; 52: cam groove; 53: tubular guide member; 54: guide groove; 55: claw holder; 57: cam follower; 58: chuck claw switching mechanism; 61: height regulating member; 65: driving mechanism; 67: pivoting lever; 72, 73: engaging groove; 79: lock hole; 80: opening and closing lever; 81: rotation locking member; 82: rotation locking member moving mechanism; 83: ball screw device; 84: lifting and lowering member; 86: cam groove; 87: cam follower; 88: lock pin; 89: optical sensor; 90: rotation stopper; 91: control device; 96: vertical slide member

The invention claimed is:

1. A component mounting machine comprising:
a chuck device held on a mounting head, the chuck device being provided with multiple types of chuck claws configured to clamp a component, a chuck claw switching mechanism configured to switch a chuck claw in use among the multiple types of chuck claws in accordance with the type of the component to be clamped, and a driving mechanism configured to cause the chuck claws switched by the chuck claw switching mechanism to perform a clamping operation,
wherein the chuck claw switching mechanism is configured to use a cylindrical cam, the multiple types of chuck claws are arranged at predetermined intervals around the cylindrical cam, and a cam follower provided on each of the chuck claws is configured to fit into a cam groove in an outer peripheral surface of the cylindrical cam,
wherein a tubular guide member that guides upward and downward movement of each of the chuck claws is provided concentrically on an outer peripheral side of the cylindrical cam, the respective chuck claws are configured to be moved upward and downward independently of each other by the cylindrical cam being rotated in a state where rotation of the tubular guide member is locked when the switching is performed to the chuck claw in use among the multiple types of chuck claws, a chuck claw not used among the multiple types of chuck claws is configured to be lifted to a retraction position not interfering with the clamping operation of the chuck claw in use, and the chuck claw in use is configured to be lowered to a clamping operation position below the retraction position,
wherein a rotation locking member configured to lock the rotation of the tubular guide member during the switching of the chuck claw in use and a rotation locking member moving mechanism configured to move the rotation locking member between a lock position at which the rotation of the tubular guide member is locked and an unlock position at which the rotation of the tubular guide member is not locked are provided in the mounting head, and
wherein the respective chuck claws are moved upward and downward independently of each other by the cylindrical cam being rotated based on rotation of a rotary shaft of the mounting head in a state where the rotation of the tubular guide member is locked by the rotation locking member being moved to the lock position by the rotation locking member moving mechanism when switching is performed of the chuck claw in use.

2. The component mounting machine according to claim 1, wherein multiple lock holes having a predetermined positional relationship with the multiples types of chuck claws are formed in the tubular guide member and the rotation of the tubular guide member is locked in a state where any one of the multiple types of chuck claws has been lowered to the clamping operation position because the rotation locking member is configured to be fitted into any one of the multiple lock holes by the rotation locking member being moved to the lock position.

3. The component mounting machine according to claim 1,
wherein the rotation locking member moving mechanism is configured to be capable of moving the rotation locking member to not only the lock position and the unlock position but also a switching initialization position at which a switching state of the chuck claw returns to a certain state,
wherein a rotation stopper is provided in an outer peripheral portion of the tubular guide member, and
wherein the switching state of the chuck claw returns to the certain state by the tubular guide member being rotated along with the cylindrical cam based on the rotation of the rotary shaft of the mounting head in a state where the rotation locking member has been moved to the switching initialization position by the rotation locking member moving mechanism, the rotation of the tubular guide member being stopped by the rotation stopper hitting against the rotation locking member during the rotation, and the cylindrical cam being rotated to reach a certain position by the rotary shaft of the mounting head continuing to rotate thereafter.

4. The component mounting machine according to claim 1,
wherein the chuck device includes a holding plate section at an upper end of the chuck device, a cylindrical outer case fixed to a lower surface side of the holding plate section, and a cylinder case of an air cylinder assembled inside the outer case and which is capable of moving upward and downward,
wherein the cylindrical cam is concentrically fixed on a lower side of the cylinder case, and
wherein the rotation of the rotary shaft of the mounting head case causes the cylindrical cam to rotate integrally with the holding plate section, the outer case, and the cylinder case.

5. The component mounting machine according to claim 4,
wherein an upper end portion of the tubular guide member is supported to be capable of rotating with respect to the cylindrical cam,
wherein the tubular guide member includes a plurality of guide grooves that respectively guide vertical movement of the chuck claws, and
wherein each of the chuck claws includes a claw holder, the claw holder being U-shaped and holding the chuck claw at a lower end thereof, and
wherein U-shaped grooves of each of the claw holders are fitted into the cylindrical cam to be capable of sliding in a rotational direction thereof.

* * * * *